United States Patent
Kajikawa et al.

(10) Patent No.: US 11,848,216 B2
(45) Date of Patent: Dec. 19, 2023

(54) CLEANING APPARATUS FOR CLEANING MEMBER, SUBSTRATE CLEANING APPARATUS AND CLEANING MEMBER ASSEMBLY

(71) Applicant: Ebara Corporation, Tokyo (JP)

(72) Inventors: Takayuki Kajikawa, Tokyo (JP); Takeshi Iizumi, Tokyo (JP); Masayoshi Imai, Tokyo (JP)

(73) Assignee: Ebara Corporation, Tokyo (JP)

( * ) Notice: Subject to any disclaimer, the term of this patent is extended or adjusted under 35 U.S.C. 154(b) by 226 days.

(21) Appl. No.: 17/212,485

(22) Filed: Mar. 25, 2021

(65) Prior Publication Data
US 2021/0305069 A1   Sep. 30, 2021

(30) Foreign Application Priority Data

Mar. 30, 2020 (JP) .................................. 2020-059371
Dec. 24, 2020 (JP) .................................. 2020-215167

(51) Int. Cl.
| | | |
|---|---|---|
| *H01L 21/67* | (2006.01) | |
| *B08B 1/04* | (2006.01) | |
| *B08B 13/00* | (2006.01) | |
| *B08B 1/00* | (2006.01) | |

(52) U.S. Cl.
CPC ........ *H01L 21/67046* (2013.01); *B08B 1/002* (2013.01); *B08B 1/04* (2013.01); *B08B 13/00* (2013.01)

(58) Field of Classification Search
CPC .. B08B 3/04; B08B 1/002; B08B 1/04; B08B 13/00; H01L 21/6704; H01L 21/02041; H01L 21/02043; H01L 21/02052; H01L 21/02057; H01L 21/02087; H01L 21/6708
USPC ........................ 15/77, 88.2, 88.3, 102, 103.5
See application file for complete search history.

(56) References Cited

U.S. PATENT DOCUMENTS

| | | | |
|---|---|---|---|
| 2017/0236730 A1* | 8/2017 | Imamura ........... | H01L 21/68728 134/57 R |
| 2021/0175099 A1* | 6/2021 | Isokawa ................ | B08B 13/00 |

FOREIGN PATENT DOCUMENTS

JP    2016-152345 A    8/2016

* cited by examiner

*Primary Examiner* — Tom Rodgers
*Assistant Examiner* — Abbie E Quann
(74) *Attorney, Agent, or Firm* — Leydig, Voit & Mayer, Ltd.

(57) ABSTRACT

As an aspect of the present invention, a cleaning apparatus for cleaning member has a holding part holding a cleaning member assembly having a cleaning member; an inner cleaning liquid supply part; an outer cleaning liquid supply part; and a control part controlling the substrate cleaning apparatus to perform a first process in which the cleaning member is pressed against a dummy substrate at a first pressure and the outer cleaning liquid supply part supplies the cleaning liquid to the dummy substrate, and to perform a second process in which the cleaning member is separated from the dummy substrate or is pressed against the dummy substrate at a second pressure which is equal to or less than the first pressure and the inner cleaning liquid supply part supplies the cleaning liquid.

13 Claims, 17 Drawing Sheets

CLEANING APPARATUS FOR CLEANING MEMBER, SUBSTRATE CLEANING APPARATUS AND CLEANING MEMBER ASSEMBLY

TECHNICAL FIELD

The present invention relates to a cleaning apparatus for cleaning member to clean a cleaning member, a substrate cleaning apparatus and a cleaning member assembly.

The present application claims the priority of Japanese Patent Application No. 2020-059371 filed on Mar. 30, 2020 and Japanese Patent Application No. 2020-215167 filed on Dec. 24, 2020, the contents of which are entirely incorporated by reference.

BACKGROUND ART

Conventionally, new cleaning members have contaminants attached thereto, and need to be cleared of these contaminants and initialized before use. In addition, if a substrate is continuously cleaned with the purified cleaning member, particles on the substrate such as polishing slurry existing on the substrate to be processed accumulate on the cleaning member, which lowers the cleaning ability of the cleaning member. In order to solve such a problem, JP 2016-152345 A proposes a substrate cleaning apparatus that rotates a substrate and cleans the substrate while bringing a cleaning member into contact with the rotating substrate. This substrate cleaning apparatus includes a self-cleaning member that is provided on an arm supporting the cleaning member and comes into contact with the cleaning member for self-cleaning, and a moving mechanism that is provided on the arm supporting the cleaning member and moves the self-cleaning member between the position where the self-cleaning member is brought in contact with the cleaning member and the position where the self-cleaning member is separated from the cleaning member.

SUMMARY OF INVENTION

Problem to be Solved by Invention

JP 2016-152345 A also discloses an aspect in which a cleaning liquid is supplied to a contact part between the cleaning member and the self-cleaning member. However, it has been found that, in this conventional aspect in which a cleaning liquid is supplied from the outside to the contact part between the cleaning member and the self-cleaning member, the particle removal performance may not be exerted as expected in the cleaning process after polishing of the substrate using recently studied specific slurry.

The present invention provides a cleaning apparatus for cleaning member that is capable of efficiently cleaning a cleaning member, a substrate cleaning apparatus and a cleaning member assembly.

Means for Solving Problem

[Concept 1]
A cleaning apparatus for cleaning member may comprise:
a substrate support part that holds a substrate;
a holding part that holds a cleaning member assembly having a cleaning member;
a member rotation part that rotates the cleaning member;
an inner cleaning liquid supply part that supplies a cleaning liquid into the cleaning member;
an outer cleaning liquid supply part that supplies a cleaning liquid from outside of the cleaning member; and
a control part that controls the cleaning apparatus to perform a first process in which the cleaning member is pressed against the substrate at a first pressure and the outer cleaning liquid supply part supplies the cleaning liquid to the substrate, and to perform a second process in which the cleaning member is separated from the substrate or is pressed against the substrate at a second pressure which is equal to or less than the first pressure and the inner cleaning liquid supply part supplies the cleaning liquid.

[Concept 2]
In the cleaning apparatus for cleaning member according to concept 1,
the outer cleaning liquid supply part may stop a supply of the cleaning liquid to the substrate during the second process.

[Concept 3]
In the cleaning apparatus for cleaning member according to concept 1 or 2,
the outer cleaning liquid supply part may supply the cleaning liquid to the substrate during the second process.

[Concept 4]
In the cleaning apparatus for cleaning member according to any one of concepts 1 to 3,
a second rotation speed of the cleaning member during the second process may be higher than a first rotation speed of the cleaning member during the first process.

[Concept 5]
In the cleaning apparatus for cleaning member according to any one of concepts 1 to 4,
the inner cleaning liquid supply part may supply a rinse liquid and the outer cleaning liquid supply part supplies a chemical liquid, the inner cleaning liquid supply part may supply a chemical liquid and the outer cleaning liquid supply part supplies a rinse liquid, or the inner cleaning liquid supply part and the outer cleaning liquid supply part may supply a chemical liquid.

[Concept 6]
In the cleaning apparatus for cleaning member according to any one of concepts 1 to 5,
the inner cleaning liquid supply part may supply a first chemical liquid, and the outer cleaning liquid supply part may supply a second chemical liquid different from the first chemical liquid.

[Concept 7]
In the cleaning apparatus for cleaning member according to any one of concepts 1 to 6,
the control part may control the inner cleaning liquid supply part to supply the cleaning liquid while the cleaning member is pressed against the substrate at the second pressure, and
the second pressure may be ½ or less of the first pressure.

[Concept 8]
In the cleaning apparatus for cleaning member according to any one of concepts 1 to 7,
the control part may control a transfer part to replace the substrate, and control the cleaning apparatus to perform a plurality of sets of the first process, the second process and a replacement process of the substrate.

[Concept 9]
In the cleaning apparatus for cleaning member according to concept 8,
the first pressure in a latter set may be lower than the first pressure in a former set.

[Concept 10]

In the cleaning apparatus for cleaning member according to any one of concepts 1 to 9, the control part may control such that the substrate and the cleaning member rotate in opposite directions when the first pressure is equal to or higher than a threshold value, and the substrate and the cleaning member rotate in a same direction when the first pressure is less than the threshold value.

[Concept 11]

In the cleaning apparatus for cleaning member according to any one of concepts 1 to 10, the outer cleaning liquid supply part may continue to supply the cleaning liquid during the first process and the second process, and the inner cleaning liquid supply part may supply a rinse liquid, and stops a supply of the rinse liquid during the first process.

[Concept 12]

In the cleaning apparatus for cleaning member according to any one of concepts 1 to 11, the inner cleaning liquid supply part may supply a rinse liquid, the control part may control such that a first time during which the first process is performed is longer than a second time during which the second process is performed.

[Concept 13]

In the cleaning apparatus for cleaning member according to any one of concepts 1 to 12, the control part may control the outer cleaning liquid supply part to perform a flushing process before cleaning the substrate to which a cleaning process will be performed.

[Concept 14]

A cleaning member assembly may comprise the cleaning member cleaned by the cleaning apparatus for cleaning member according to any one of concepts 1 to 13.

[Concept 15]

A substrate cleaning apparatus for cleaning a substrate may comprise:

a substrate support part that holds a substrate;

a substrate cleaning liquid supply part that supplies a cleaning liquid to the substrate;

a holding part that holds a cleaning member assembly having a cleaning member;

a member rotation part that rotates the cleaning member;

an inner cleaning liquid supply part that supplies a cleaning liquid into the cleaning member;

an outer cleaning liquid supply part that supplies a cleaning liquid from outside of the cleaning member; and a control part that controls the substrate cleaning apparatus to perform a first process in which the cleaning member is pressed against the substrate at a first pressure and the outer cleaning liquid supply part supplies the cleaning liquid to the substrate, and to perform a second process in which the cleaning member is separated from the substrate or is pressed against the substrate at a second pressure which is equal to or less than the first pressure and the inner cleaning liquid supply part supplies the cleaning liquid.

[Concept 16]

A cleaning member assembly may comprise the cleaning member cleaned by the substrate cleaning apparatus according to concept 15.

According to the present invention, a cleaning apparatus for cleaning member and so on capable of efficiently cleaning a cleaning member can be provided.

DETAILED DESCRIPTION

Description of Embodiments

«Configuration»

An embodiment of a substrate processing apparatus including a substrate cleaning apparatus and the like will be described. The following embodiment is an example of application to a cleaning process of a semiconductor wafer (object to be processed), particularly a cleaning process using a chemical liquid. However, the present invention is not limited to application to a wafer cleaning process.

Figure 1:
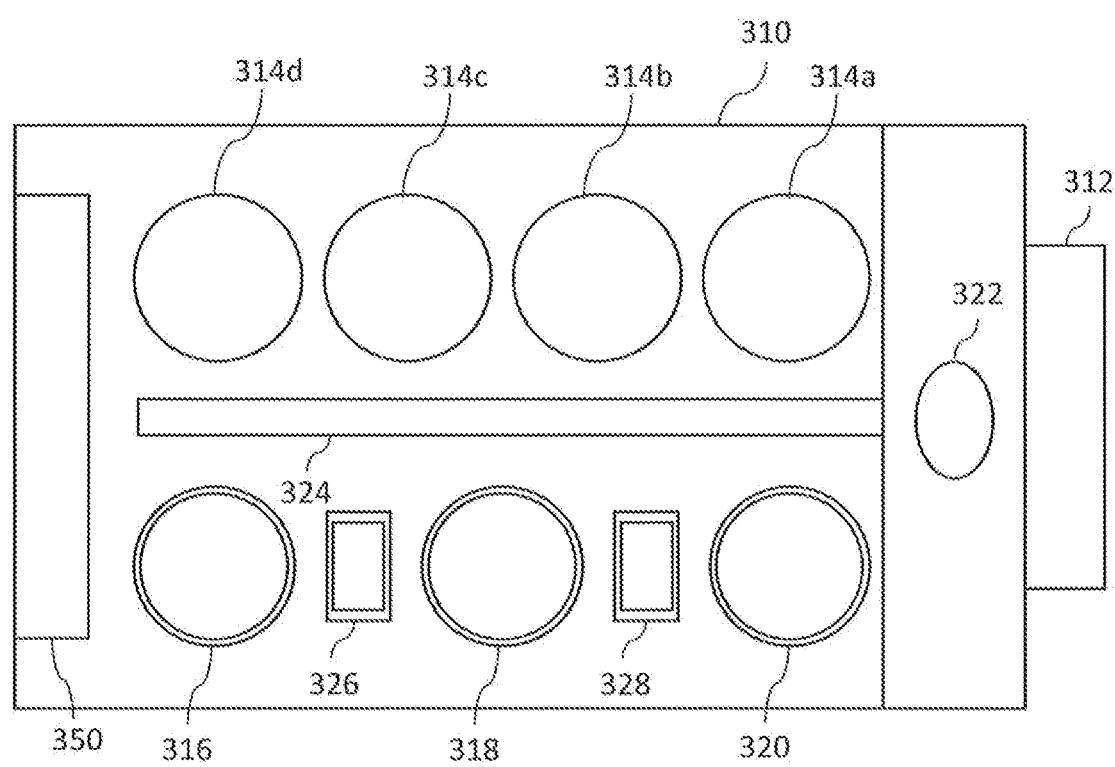
FIG. 1 is a schematic plan view showing the overall configuration of a substrate processing apparatus according to an embodiment of the present invention.

As shown in FIG. 1, the substrate processing apparatus, according to the present embodiment, has a roughly rectangular housing 310 and a load port 312; a substrate cassette that stocks a number of substrates W is put on the load port 312. The load port 312 is placed adjacent to the housing 310. The load port 312 can be loaded with an open cassette, a SMIF (Standard Mechanical Interface) pod or a FOUP (Front Opening Unified Pod). A SMIF pod and a FOUP are hermetically sealed enclosure that stores therein a substrate cassette and covers it with a bulkhead, and whereby an environment independent of the external space can be maintained. The substrate W is, for example, a semiconductor wafer and the like.

Inside the housing 310, a plurality of (in an aspect shown in FIG. 1, four) polishing units 314a to 314d, first and second cleaning units 316 and 318 for cleaning a polished substrate W, and a drying unit 320 for drying the cleaned substrate W is contained. The polishing units 314a to 314d are arranged along a long side of the substrate processing apparatus, and the cleaning units 316 and 318 and the drying unit 320 are also arranged along the long side of the substrate processing apparatus. The substrate processing apparatus according to the present embodiment can polish various substrates W in a step of manufacturing a semiconductor wafer with a diameter of 300 mm or 450 mm, a flat panel, an image sensor such as complementary metal oxide semiconductor (CMOS) or charge coupled device (CCD), and a magnetic film in a magnetoresistive random access memory (MRAM). The substrate processing apparatus according to another embodiment may be configured to clean and dry a substrate W without a polishing unit for polishing the substrate W inside the housing 310.

In an area surrounded by the load port 312, and the polishing unit 314a and the drying unit 320 that are located on the side of the load port 312, a first transfer robot 322 is placed. Furthermore, a conveyance unit 324 is placed parallel to the polishing units 314a to 314d as well as the cleaning units 316 and 318 and the drying unit 320. The first transfer robot 322 receives a pre-polished substrate W from the load port 312 and transfers the substrate W to the conveyance unit 324, or receives a dried substrate W, which is taken out from the drying unit 320, from the conveyance unit 324.

A second transfer robot 326 for transferring a substrate W between the first cleaning unit 316 and the second cleaning unit 318 is placed between the first cleaning unit 316 and the second cleaning unit 318, and a third conveyance unit 328 for transferring the substrate W between the second cleaning unit 318 and the drying unit 320 is placed between the second cleaning unit 318 and the drying unit 320. Furthermore, inside the housing 310, a control part (overall control part) 350 for controlling the operation of each device of the substrate processing apparatus is placed. In the present embodiment, there is described the aspect in which the control part 350 is placed inside the housing 310; however, the placement of the control part 350 is not limited to this, and the control part 350 may be placed outside the housing 310, and the control part 350 may be provided at a remote place.

A roll cleaning apparatus for scrubbing a surface of a substrate W while rotating around the center axis parallel with the substrate W by bringing the roll cleaning member 90 linearly extending almost along the full diameter of the substrate W into contact with cleaning liquid may be used for the first cleaning unit 316. A pencil cleaning apparatus for scrubbing a surface of a substrate W by bringing the contact faces of the vertically-extending columnar pencil cleaning members into contact with cleaning liquid and moving the pencil cleaning members in one direction while rotating may be used for the second cleaning unit 318. A spin drying unit for drying a substrate W by injecting IPA steam from a moving injection nozzle toward the horizontally-held and rotating substrate W and drying the substrate W by centrifugal force by faster rotating the substrate W may be used for the drying unit 320.

The first cleaning unit 316 may use not a roll cleaning apparatus, but a pencil cleaning apparatus similar to the second cleaning unit 318 or a two-fluid jet cleaning apparatus for cleaning a surface of a substrate W by two-fluid jet. Further, the second cleaning unit 318 may use not a pencil cleaning apparatus, but a roll cleaning apparatus similar to the first cleaning unit 316, or a two-fluid jet cleaning apparatus for cleaning a surface of a substrate W by two-fluid jet.

The cleaning liquid in the present embodiment contains rinse liquid, such as deionized water (DIW), and chemical liquid, such as ammonia hydrogen peroxide (SC1), hydrochloric acid hydrogen peroxide (SC2), sulfuric acid hydrogen peroxide (SPM), sulfuric acid hydrolysate, or hydrofluoric acid. The cleaning liquid may be a mixed solution or a diluted solution containing these as the main components. In the present embodiment, unless otherwise specified, cleaning liquid means either rinse liquid, chemical liquid or the both rinse liquid and chemical liquid. The cleaning of the present embodiment includes an aspect in which a cleaning member such as the roll cleaning member 90 or a pen cleaning member 90a is rotated and brought into contact with a substrate and a cleaning liquid is supplied to the substrate for scrub cleaning, and an aspect in which a cleaning liquid is simply supplied to a substrate without bringing any member into contact with the substrate.

Figure 2:
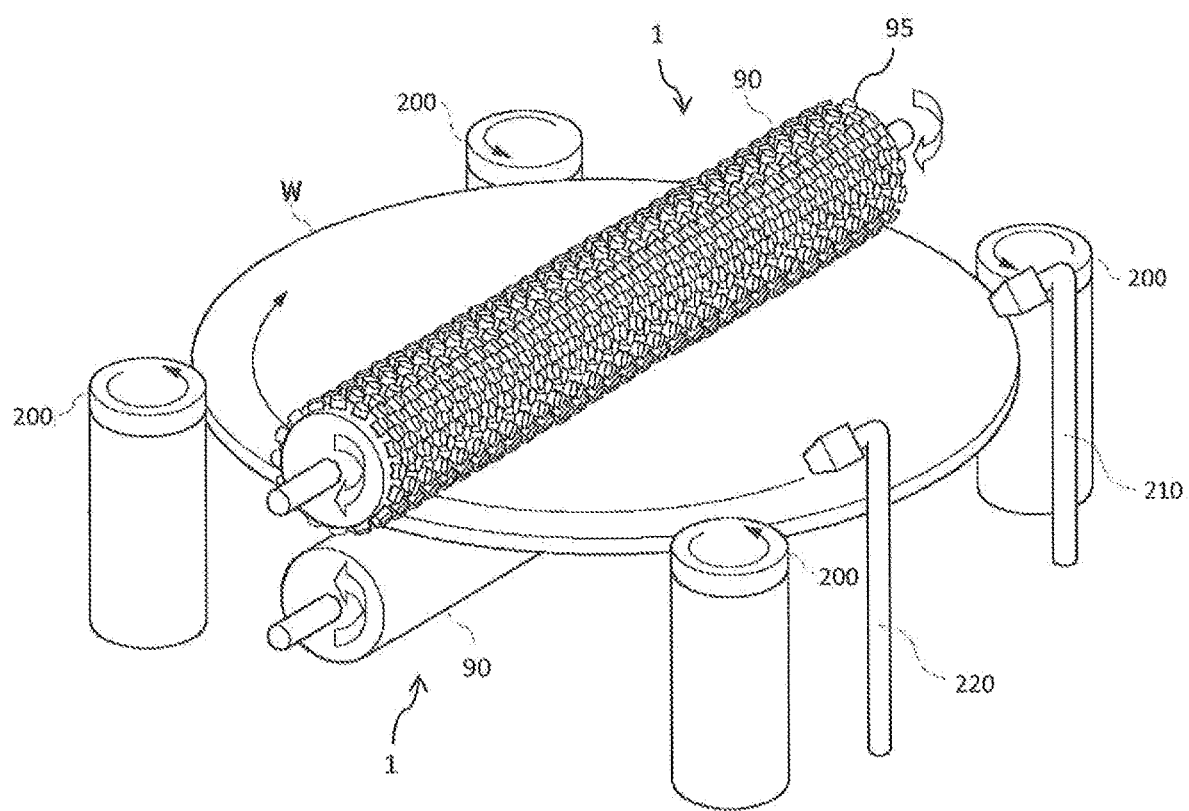
FIG. 2 is a perspective view of a substrate cleaning apparatus that can be used in the embodiment of the present invention.
Figure 3:
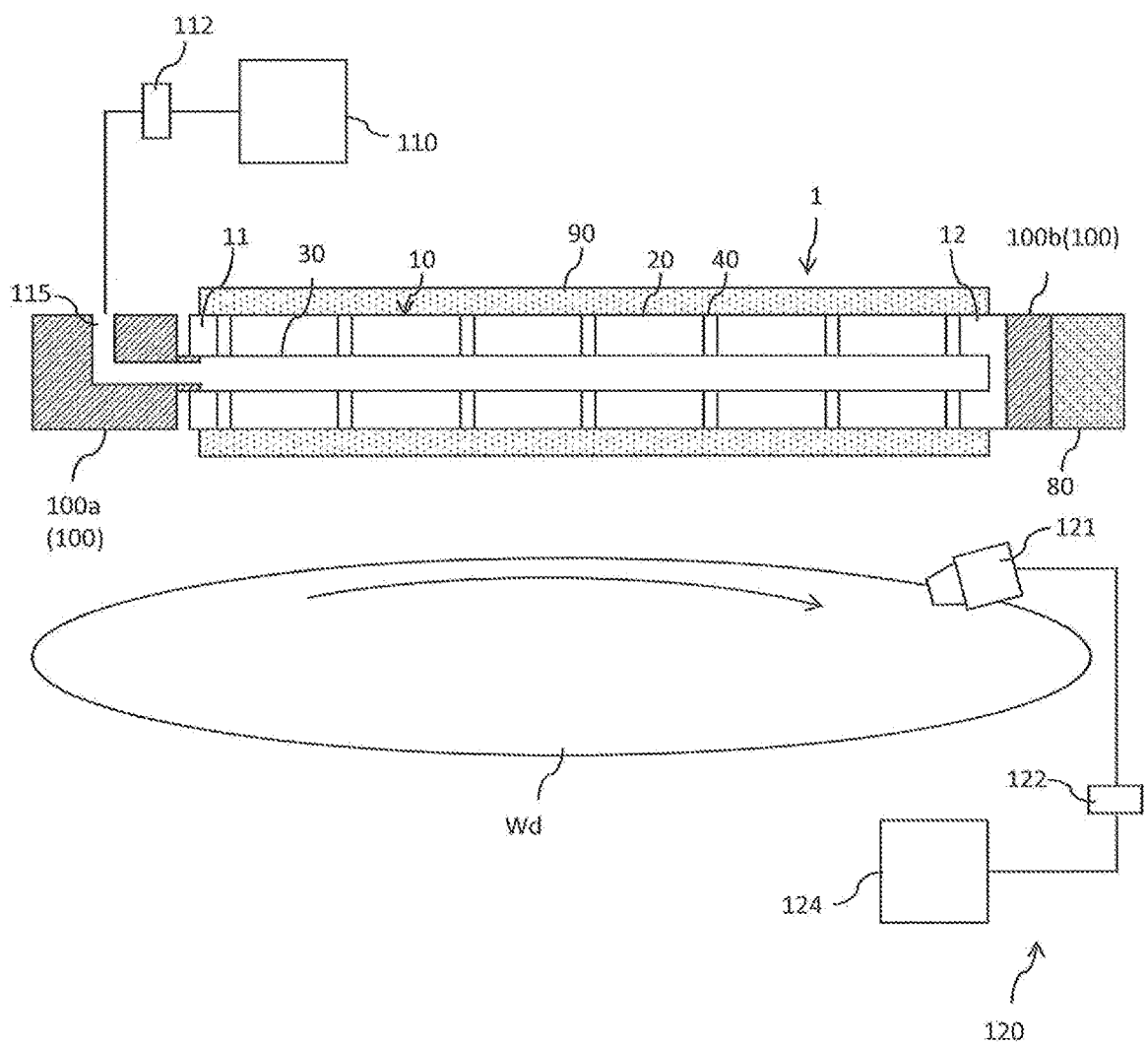
FIG. 3 is a diagram showing a cleaning apparatus for cleaning member used as an example of the embodiment of the present invention.

As shown in FIG. 3, the cleaning member assembly 1 may have a cleaning member mounting part 10 and a cleaning member mounted on a surface of the cleaning member mounting part 10. Hereinafter, the roll cleaning member 90 will be described as an example of the cleaning member, but the present invention is not limited to this member. The aspect of the present embodiment can also be used for cleaning members such as a pencil cleaning member, brush, and mandrill. As shown in FIG. 2, the roll cleaning member 90 may be made of a sponge having a plurality of nodules (projection members) 95. The area of the top of each nodule 95 may be 5 cm² or less. PVDF or PTFE may be used as the material of the cleaning member mounting part 10.

As shown in FIG. 2, the substrate cleaning apparatus may have a substrate support part 200 that holds the substrate W. The substrate support part 200 may hold the substrate W so as to extend in the horizontal direction, may hold the substrate W so as to extend in the vertical direction, or may hold the substrate W in an inclined manner from the horizontal direction. The substrate support part 200 may rotate while holding the substrate W by chucking or suctioning, or may support the substrate W while rotating the substrate W like a spindle shown in FIG. 2. A chemical liquid supply part 210 for supplying a chemical liquid to the substrate W and a rinse liquid supply part 220 for supplying a rinse liquid to the substrate W may be provided. In the present embodiment, a substrate cleaning liquid supply part that supplies the cleaning liquid to the substrate W includes the chemical liquid supply part 210 and the rinse liquid supply part 220.

The present embodiment will be described with reference to an aspect in which the cleaning apparatus for cleaning member includes the substrate cleaning apparatus. That is, the present embodiment will be described with reference to an aspect in which, in the substrate cleaning apparatus used for cleaning the substrate W used in a series of processing steps for mass-production of semiconductor substrate wafers and the like, the cleaning apparatus for cleaning member, which cleans a cleaning member, (self-cleaning apparatus or break-in apparatus 600 (see FIG. 17)) is also used as the substrate cleaning apparatus. However, the present invention is not limited to this aspect. A dedicated cleaning apparatus for cleaning member may be provided separately from the substrate cleaning apparatus. When such a dedicated cleaning apparatus for cleaning member is used, it is not necessary to use the substrate cleaning apparatus used for the cleaning process of the substrate W as the cleaning apparatus for cleaning member. Therefore, it is advantageous in that the operating time of the substrate cleaning apparatus can be lengthened and the number of substrates processed can be improved (the operating rate of the apparatus can be increased). US Patent Application No. 2019/0088509A1 related to a dedicated cleaning device for cleaning member is incorporated herein by reference in its entirety.

Further, at the time of cleaning a cleaning member such as the roll cleaning member 90, a dummy substrate Wd may be used as the substrate. Hereinafter, the present embodiment will be described with reference to an aspect in which the dummy substrate Wd is used as the substrate. However, the present invention is not limited to this. The cleaning member may be cleaned using the substrate W such as a wafer used in mass production. When a chemical liquid is used as a cleaning liquid for the dummy substrate Wd having a metal film, the metal film may dissolve. Therefore, in order to use a chemical liquid as a cleaning liquid, the dummy substrate Wd preferably has an insulating film such as an oxide film. This insulating film may be tetraethoxysilane (TEOS).

As shown in FIG. 3, the cleaning apparatus for cleaning member may have: a holding part 100 that holds a cleaning member assembly 1 having the roll cleaning member 90; a member rotation part 80 that rotates the roll cleaning member 90; an inner cleaning liquid supply part 110 that supplies a cleaning liquid into the roll cleaning member 90; and an outer cleaning liquid supply part 120 that supplies a cleaning liquid from outside of the roll cleaning member 90.

In one embodiment, the member rotation part 80 includes, for example, a motor and a transmission part such as a belt that transmits the driving force of the motor. The member rotation part 80 and the cleaning member assembly 1 are connected via the holding part 100. The rotational driving force generated by the member rotation part 80 is transmitted to the roll cleaning member 90 in the cleaning member assembly 1. The member rotation part 80 can also have a stopper that can operate the cleaning member assembly 1 vertically (with respect to the substrate W) and stop the cleaning member assembly 1 at a predetermined position. In one embodiment, a cylinder mechanism for moving the roll cleaning member up and down can be provided. In order to rotate the roll cleaning member, the motor generates a driving force and then transmits the driving force to a transmission part such as a belt so that the roll cleaning member 90 rotates around an axial center along the longitudinal direction. A sensor for measuring the position of the roll cleaning member is provided to enable motion control of the roll cleaning member in each of x, y, and z axes, and the control part receives a signal obtained by the sensor, generates a displacement signal for displacing the position of the roll cleaning member, and transmits the displacement signal to the member rotation part or the cylinder. The position of the roll cleaning member can be thus controlled to an optimum position.

A more specific example will be described with reference to FIG. 13.

Figure 13:
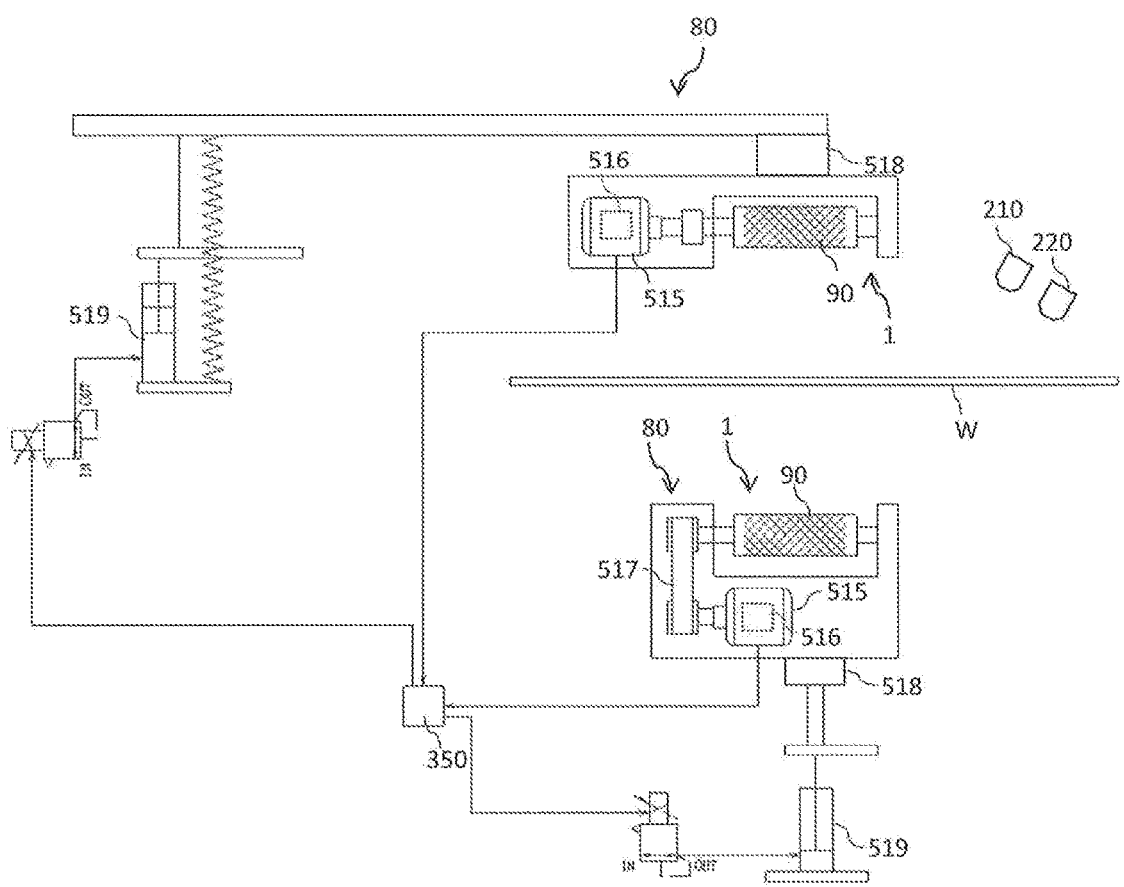
FIG. 13 is a configuration diagram showing an outline of a configuration of a roll cleaning apparatus used in the embodiment of the present invention.

As shown in FIG. 13, a roll pressing drive part 519 for pressing the roll cleaning member 90 against the substrate W and separating the roll cleaning member 90 from the substrate W may be provided. In addition, a transmission part 517 including a belt or the like for transmitting the rotational force by the drive part 515 such as a motor may be provided. The roll cleaning member 90 may be driven by direct motion of the drive part 515, or may be driven by indirect electric power via a belt or the like.

The member rotation part 80 may have a torque detection part 516 that detects torque applied to the drive part 515, and a pressing force detection part 518 that detects the pressing force of the roll cleaning member 90 against the substrate W by the pressing drive part 519. For example, a load cell may be used as the pressing force detection part 518.

The control part 350 may control the pressing force of the roll cleaning member 90 against the substrate W by the pressing drive part 519 based on the detection result from the torque detection part 516. For example, the control part 350 controls the pressing force of the roll cleaning member 90 against the substrate W so that the torque applied to the drive part 515 falls within a certain range (a second range described later) or takes a constant value.

The control part 350 may control the pressing force of the roll cleaning member 90 against the substrate W by the pressing drive part 519 based on the detection result from the pressing force detection part 518.

Further, the control part 350 may control the pressing force of the roll cleaning member 90 against the substrate W by the pressing drive part 519 based on the detection result from the pressing force detection part 518 until a first time (for example, one to three seconds) elapses after the roll cleaning member 90 comes into contact with the substrate W, and then may control the pressing force based on the detection result from the torque detection part 516 after the lapse of the first time. Otherwise, instead of this aspect, the control part 350 may control the pressing force of the roll cleaning member 90 against the substrate W based on the detection result from the pressing force detection part 518 such that the pressing force does not become excessively large or excessively small (threshold control).

When the first time has elapsed, the control part 350 may determine whether the pressing force of the roll cleaning member 90 against the substrate W is within the first range based on the detection result from the pressing force detection part 518. If the pressing force is outside the first range, the control part 350 may control the pressing drive part 519 such that the pressing force is within the first range.

The torque detection part 516 may detect the torque multiple times within a predetermined time, and the control part 350 may control the pressing force based on the values of the plurality of torques detected by the torque detection part 516 (for example, using the average value of the values of the plurality of torques). The torque detection part 516 may detect the torque at predetermined time intervals (for example, every 0.1 to 0.3 seconds). As an example, the control part 350 may control the pressing force based on two to five consecutive detection results. For example, the torques may be detected at three points every 0.1 seconds, and the average value of the torques at these points may be used to control the pressing force applied to the substrate W from the roll cleaning member 90. In one embodiment, when scrubbing the substrate with the roll cleaning member 90, the pressing force of the cleaning member against the substrate W may be controlled based on the values of a plurality of torques detected within a predetermined time by the torque detection unit 516.

If the member rotation part 80 rotates at a predetermined rotation speed, the member rotation part 80 attempts to achieve a constant rotation speed, so that the torque applied repeatedly takes large and small values. That is, when the torque increases at a certain point, the pressing force applied to the substrate W from the roll cleaning member 90 is controlled to decrease, which results in torque decrease. When the torque decreases in this way, the pressing force applied to the substrate W from the roll cleaning member 90 is controlled to increase, which results in torque increase. Since the member rotation part 80 is controlled by repeating this process, taking an average value makes it possible to control the pressing force using a highly accurate torque value. Since the torque repeats increasing and decreasing during one rotation of a rotating shaft, this cycle of increase and decrease may be stored as a set value in advance. Then, the above torque monitoring may be performed taking into account the influence of increase/decrease during one rotation of the rotating shaft. As the amount of torque fluctuation in one rotation of the roll cleaning member 90 is smaller, it is possible to reduce variations in the cleaning effect due to the difference in the rotation position of the roll cleaning member 90 (the circumferential locations of the nodules 95 in contact with the object to be cleaned such as the substrate W).

The torque detection part 516 may detect torque multiple times within the time required for the roll cleaning member 90 to rotate n times ("n" is an integer), and the control part 350 may use the average value to control the pressing force applied to the substrate W from the roll cleaning member 90.

The control part 350 may control the torque so as to take different values for at least two different types of cleaning liquids. Further, when the type of the substrate W is different, the control part 350 may control the pressing force applied to the substrate W from the roll cleaning member 90 so as to produce a different torque value.

The control part 350 may control the pressing drive part 519 so that the torque falls within a second range based on the detection result from the torque detection part 516. The control part 350 may intermittently detect, based on the detection result from the torque detection part 516, whether the torque is within the second range at predetermined time intervals. If the torque is outside the second range, the control part 350 may control the pressing drive part 519 such that the torque is within the second range. Further, the control part 350 may continuously detect whether the torque is within the second range based on the detection result from the torque detection part 516, and may adjust appropriately the torque so that the torque does not deviate from the second range.

When a spindle is adopted as the substrate support part 200, the control part 350 may control the pressing drive part 519 based on the detection result from the torque detection part 516 such that the torque does not exceed a first threshold value, thereby to prevent the rotation of the substrate W from being stopped. The first threshold value may be determined based on the empirical torque value with which the substrate W does not rotate or stops rotating, or may be determined based on the theoretical torque value with which the substrate W does not rotate. For example, the first threshold value may be set to a value that is 10% to 30% or less of the empirical torque value with which the substrate W does not rotate or stops rotating, or may be set to a value that is 10% to 30% or less of the theoretical torque value with which the substrate W does not rotate.

At the time of performing the first processing, for example, upon receipt of the feedback on the detection results from the torque detection part 516 and/or the pressing force detection part 518, the control part 350 may control the pressing drive part 519 to press the roll cleaning member 90 against the substrate W at a first pressure and may control the outer cleaning liquid supply part 120 to supply the cleaning liquid to the substrate W from the outer cleaning liquid supply part 120.

At the time of performing the second processing, for example, upon receipt of the feedback on the detection results from the torque detection part 516 and/or the pressing force detection part 518, the control part 350 may control the pressing drive part 519 to separate the roll cleaning member 90 from the substrate W or may control the pressing drive part 519 to press the roll cleaning member 90 against the substrate W at a second pressure. At this time, the control part 350 may control the inner cleaning liquid supply part 110 to supply the cleaning liquid into the roll cleaning member 90.

When the torque detection part 516 and/or the pressing force detection part 518 transmits a signal to the control part 350, the control part 350 receives the detection results from the torque detection part 516 and/or the pressing force detection part 518. In addition, when the control part 350 transmits a signal to the pressing drive part 519, the pressing drive part 519 receives the signal, and the pressing drive part 519 moves the roll cleaning member 90 along the normal direction of the substrate W.

Figure 17:
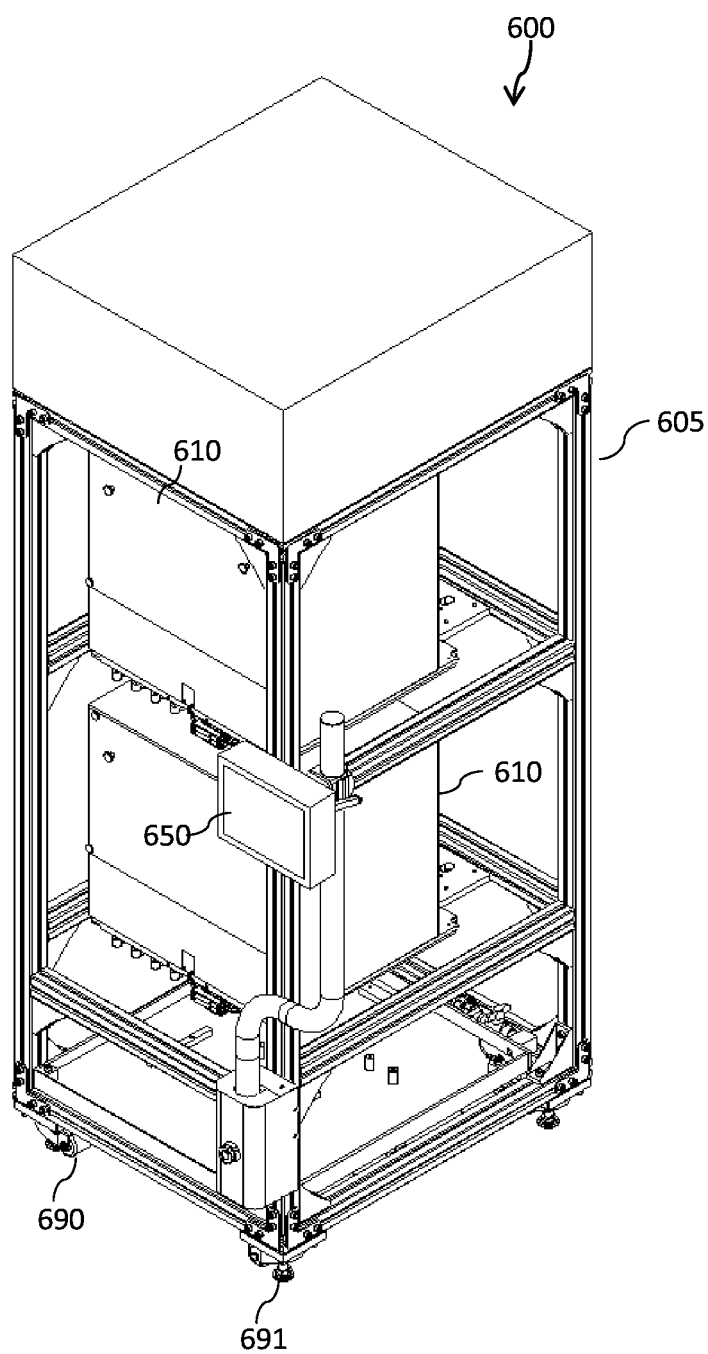
FIG. 17 is a perspective view of a break-in apparatus usable in the embodiment of the present invention.
Figure 19:
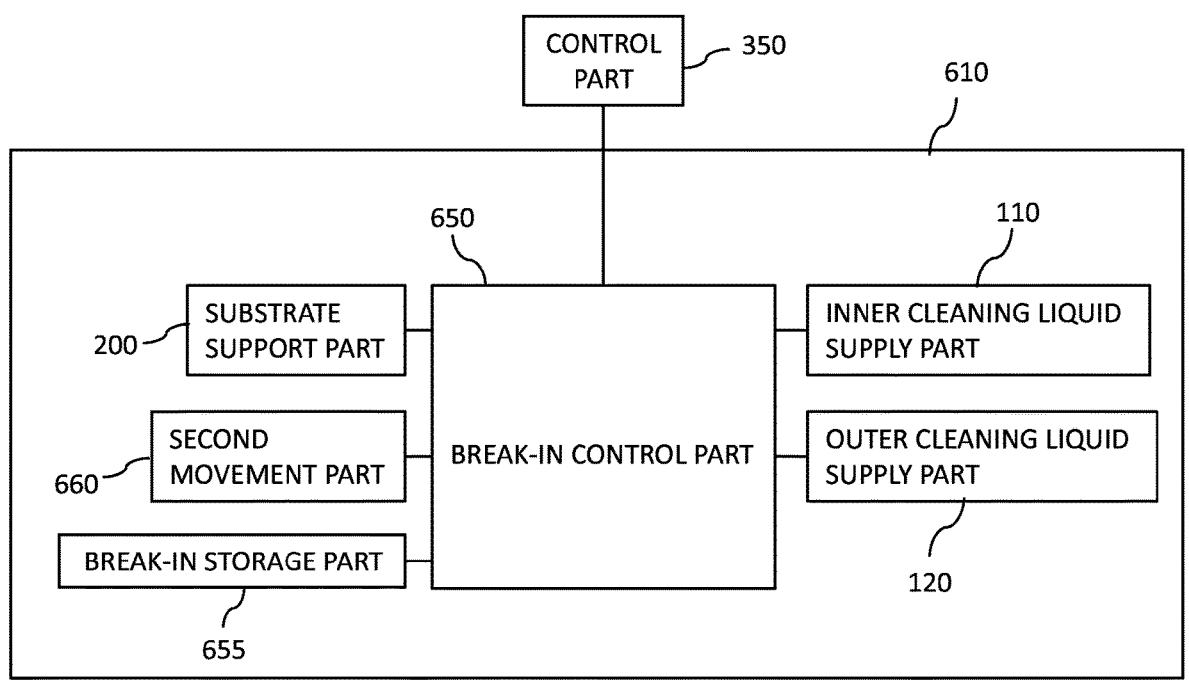
FIG. 19 is a block diagram showing the break-in module usable in the embodiment of the present invention.

As shown in FIG. 17, the break-in apparatus 600 may have a break-in casing 605, a break-in module 610 provided inside the break-in casing 605, a break-in control part 650 for controlling the break-in module 610, and a break-in storage part 655 (see FIG. 19) for storing various items of information. The break-in control part 650 is configured of a touch panel or the like, for example, and may be provided on the side of the break-in casing 605. The present embodiment will be described by way of an aspect in which two break-in modules 610 are provided inside the break-in casing 605, but is not limited thereto, and one break-in module 610 may be provided inside the break-in casing 605 or three or more break-in modules 610 may be provided inside the break-in casing 605. When a plurality of break-in modules 610 are provided inside the break-in casing 605, one or more break-in modules 610 may break in the roll cleaning members 90 and another one or more break-in modules 610 may break in the pencil cleaning members. The control in the break-in device 600 may be performed not by the break-in control part 650 but by the control part 350 which is the overall control part. Further, as shown in FIG. 19, the break-in control part 650 and the control part 350, which is the overall control part, may be communicably connected.

As shown in FIG. 17, the break-in apparatus 600 may have first movement parts 690 for enabling the break-in apparatus 600 to move. By way of example, the first movement parts 690 such as casters may be provided on the lower face of the break-in casing 605. The break-in apparatus 600 may have lock parts 691 for locking not to move by the first movement parts 690. The present embodiment will be described by way of an aspect in which four first movement parts 690 and four corresponding lock parts 691 are provided.

When the first movement parts 690 for enabling the movement of the break-in apparatus 600 are provided, it is beneficial that a position where the break-in apparatus 600 is arranged can be freely changed. If the kind of a substrate to be cleaned is changed or the number of substrates to be cleaned increases, the layout of the substrate cleaning apparatus in the housing can be changed. Thus, it is beneficial that the break-in apparatus 600 is made movable and can be easily arranged in an extra space.

Figure 18:
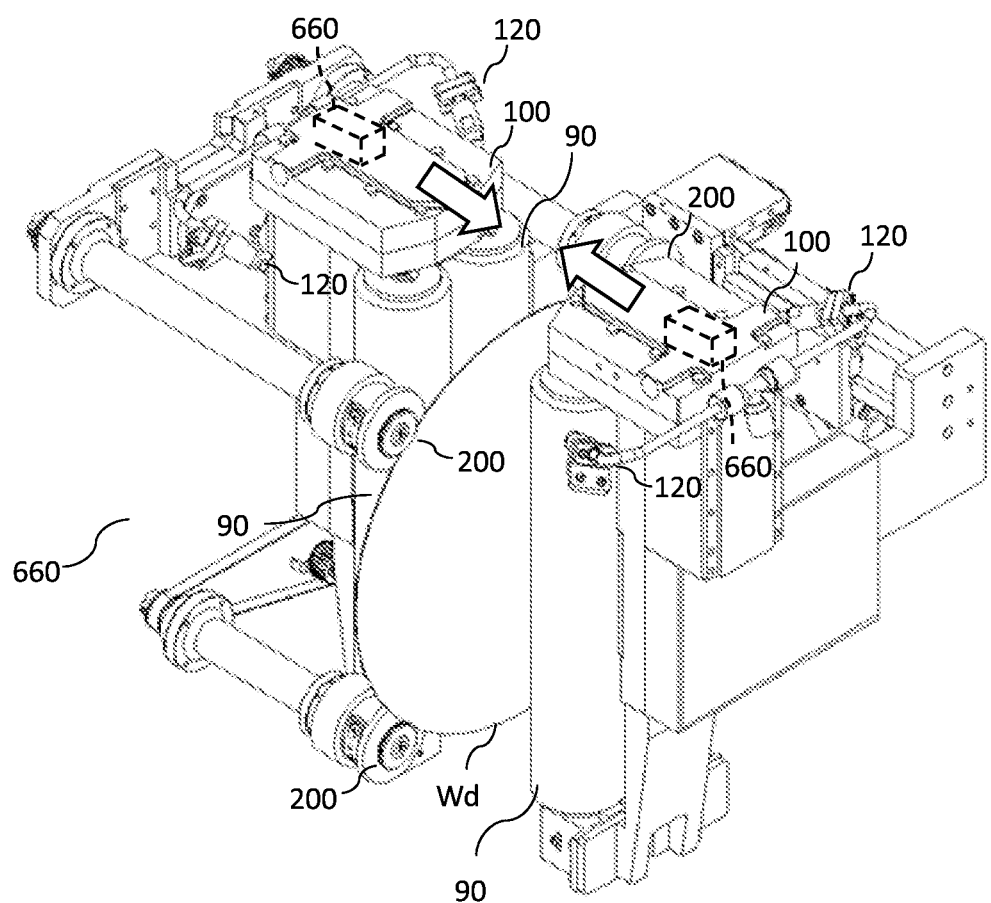
FIG. 18 is a perspective view showing a state in which a dummy substrate is attached to the break-in module.

The cleaning member holding part 100 may be configured to be able to hold three or more roll cleaning members 90 (see FIG. 18). The cleaning member holding part 100 are not limited to the configuration, and may be configured to be able to hold one or two roll cleaning members 90. In the aspects shown in FIG. 18, the cleaning member holding part 100 can hold four roll cleaning members 90.

In terms of "breaking in" the roll cleaning members 90 under a similar environment as in actual cleaning, a rotation speed of the roll cleaning members 90 by the cleaning member holding part 100 may be the same as a rotation speed employed in the cleaning step in the substrate cleaning apparatus.

As shown in FIG. 18, the substrate support parts 200 may be configured to hold the dummy substrate Wd to vertically extend (or the inplane direction of the dummy substrate Wd vertically extends) as shown in FIG. 18. The substrate support parts 200 are not limited to the configuration, and may be configured to hold a substrate to horizontally extend or to hold it obliquely relative to the horizontal direction.

In the aspects shown in FIG. 18, the four substrate support parts 200 are equally arranged (at an angle of 90° about the rotation center). The substrate support parts 200 according to the present embodiment are configured of spindles, and are configured to hold the dummy substrate Wd while rotating it. The substrate support parts 200 may employ not such spindles but chucks. In this case, the dummy substrate Wd is held by the chucks, and the dummy substrate Wd held by the chucks is rotated by a driving force from the rotation part. Any number of substrate support parts 200 capable of stably holding the dummy substrate Wd may be employed, and three or six substrate support parts 200 may be employed.

When chucks are employed as the substrate support parts 200, the substrate support parts 200 are opened when not holding the dummy substrate Wd, and are closed when holding the dummy substrate Wd. There may be configured such that the dummy substrate Wd is controlled to be opened or closed in response to an instruction from the break-in control part 650, the dummy substrate Wd is placed so that the substrate support parts 200 are automatically closed, and the dummy substrate Wd is removed (more than a certain force is applied) so that the substrate support parts 200 are automatically opened.

When the dummy substrate Wd is placed in the substrate support parts 200, the worker may place the dummy substrate Wd in the substrate support parts 200, or a substrate conveyance part such as robot arm may place the dummy substrate Wd in the substrate support parts 200.

Four outer cleaning liquid supply parts 120 are provided in the aspects shown in FIG. 18, and one outer cleaning liquid supply part 120 may be provided corresponding to one cleaning member holding part 100. One inner cleaning liquid supply part 110 (see FIG. 19) may be provided corresponding to one cleaning member holding part 100. In such aspects, it is beneficial that a cleaning liquid can be accurately supplied to each roll cleaning member 90.

Second movement parts 660 for making the cleaning member holding part 100 close to or separated from the dummy substrate Wd may be coupled to the cleaning member holding part 100 (see arrows in FIG. 18). The second movement parts 660 may be configured only to make the cleaning member holding part 100 close to or separated from the dummy substrate Wd or may be configured not to swing the cleaning member holding part 100 in order to reduce manufacture cost or to downsize the apparatus configuration.

The second movement parts 660 may move or swing the roll cleaning members 90 in the longitudinal direction of the roll cleaning members 90 or along the in-plane direction of the dummy substrate Wd orthogonal to the longitudinal direction in order to break in the entire roll cleaning members 90 including both ends in their longitudinal direction.

In the aspect shown in FIG. 18, the second movement parts 660 are provided on both of the front side and the backside of the dummy substrate Wd, respectively, and the two roll cleaning members 90 positioned on the front side of the dummy substrate Wd and the two roll cleaning members 90 positioned on the backside of the dummy substrate Wd are synchronized to be moved. The second movement parts 660 may be configured of actuators, for example.

Next, an example of a cleaning method for the roll cleaning member 90 will be described.

First, the dummy substrate Wd is supported by the substrate support part 200 such as a spindle.

Next, the substrate W is rotated, and the cleaning liquid is supplied to the substrate W from the outer cleaning liquid supply part 120.

Next, the control part 350 controls the pressing drive part 519 to press the roll cleaning member 90 against the substrate W at the first pressure (the first process). During this period, the outer cleaning liquid supply part 120 continues to supply the cleaning liquid to the substrate W.

Next, the control part 350 controls the pressing drive part 519 to separate the roll cleaning member 90 from the substrate W, or controls the pressing drive part 519 to press the roll cleaning member 90 against the substrate W at the second pressure. During or after this control, the control part 350 controls the inner cleaning liquid supply part 110 to supply the cleaning liquid into the roll cleaning member 90 (the second process). During this period, the outer cleaning liquid supply part 120 continues to supply the cleaning liquid to the substrate W.

Next, a transfer part 300 is controlled upon receipt of a signal from the control part 350, and the transfer part 300 removes the used dummy substrate Wd and carries in another dummy substrate Wd.

After that, the above steps are repeated. The dummy substrate Wd may not be replaced only after the first process and the second process are performed once, but the dummy substrate Wd may be replaced after a plurality of sets of the first process and the second process is performed.

The control part 350 may control the roll cleaning member 90 to come into contact with the dummy substrate Wd. In order to bring the roll cleaning member 90 into contact with the dummy substrate Wd, the control part 350 may control the holding part 100 to bring the roll cleaning member 90 closer to or away from the dummy substrate Wd. Instead of the above controls, the control part 350 may control the substrate support part 200 to bring the dummy substrate Wd closer to or away from the roll cleaning member 90. The rotation speed of the roll cleaning member 90 is, for example, 50 rotation/minute (rpm) to 400 rpm. The rotation speed of the dummy substrate Wd is, for example, 50 rpm to 400 rpm. When a substrate cleaning apparatus is used as the cleaning apparatus for cleaning member, the chemical liquid supply part 210 or the rinse liquid supply part 220 shown in FIG. 2 may be used as the outer cleaning liquid supply part 120.

The control part 350 may perform the first process in which the outer cleaning liquid supply part 120 supplies the cleaning liquid to the dummy substrate Wd while the roll cleaning member 90 is pressed against the dummy substrate Wd at the first pressure and the second process in which the inner cleaning liquid supply part 110 supplies the cleaning liquid to the dummy substrate Wd while the roll cleaning member 90 is separated from the dummy substrate Wd or is pressed against the dummy substrate Wd at the second pressure equal to or lower than the first pressure.

During the second process, the inner cleaning liquid including a rinsing liquid or the like may be supplied while the roll cleaning member 90 is rotated at 200 to 600 rotations/minute (rpm) in the state of being separated from the dummy substrate Wd. In particular, the roll cleaning member 90 may be rotated at around 400 rpm.

The temperature of the cleaning liquid is, for example, lower than 60 degrees. This is because if the temperature is set to 60 degrees or higher, the cleaning members such as the roll cleaning member 90 may be deteriorated. The higher the temperature of the cleaning liquid (lower than 60 degrees), the higher the effect of removing foreign substances, which is advantageous. In the present application, dust existing on the substrate W is referred to as particles, and particles and residues contained in the cleaning member such as the roll cleaning member 90 are referred to as foreign substances.

In order to separate the roll cleaning member 90 from the dummy substrate Wd (move the roll cleaning member 90 to the retracted position), the roll cleaning member 90 may be moved along the normal direction of the dummy substrate Wd, or the roll cleaning member 90 may be slightly moved along the normal direction of the dummy substrate Wd and then moved along the in-plane direction of the dummy substrate Wd.

The second rotation speed of the roll cleaning member 90 during the second process may be higher than the first rotation speed of the roll cleaning member 90 during the first process. The second rotation speed of the roll cleaning member 90 may be 1.5 to 6 times higher than the first rotation speed, and is particularly preferably 1.5 to 3 times higher.

For example, the cleaning apparatus for cleaning member of the present embodiment may be used at a break-in of a new roll cleaning member 90. Since dirt is attached to the new roll cleaning member 90 with high probability, it is beneficial to use a cleaning apparatus for cleaning member as in the present embodiment. In addition, even when the roll cleaning member 90 is used to a certain extent, dirt may adhere to the roll cleaning member 90. Therefore, the cleaning apparatus for cleaning member of the present embodiment can also be used for cleaning the roll cleaning member 90 that has been used to a certain extent.

The control part 350 may perform a plurality of sets of the first process, the second process, and the replacement process of the dummy substrate Wd. The control part 350 may repeat the first process, the second process, and the replacement process of the dummy substrate Wd, for example, only 3 to 150 times. As an example, the control part 350 may repeat the set shown in the following table (the first process, the second process, and the replacement process of the dummy substrate Wd). That is, in the first process, the outer cleaning liquid may be supplied while the roll cleaning member 90 is pressed against the dummy substrate Wd, and in the second process, the inner cleaning liquid and the outer cleaning liquid may be supplied while the roll cleaning member 90 is separated from the dummy substrate Wd (see FIG. 5). After that, the supply of the inner cleaning liquid and the outer cleaning liquid may be stopped, the dummy substrate Wd may be replaced, and the first process may be restarted.

TABLE 1

|  | First process | Second process | Replacing dummy substrate |
|---|---|---|---|
| Pressing against dummy substrate | ON | OFF | OFF |
| Inner cleaning liquid supply | OFF | ON | OFF |
| Outer cleaning liquid supply | ON | ON | OFF |

The present invention is not limited to this aspect. The dummy substrate Wd may be replaced after the first process and the second process in the above Table 1 are repeated a predetermined number of times (for example, 3 to 50 times). When the dummy substrate Wd is replaced, the outer cleaning liquid may be continuously supplied without stopping the supply of the outer cleaning liquid. According to this aspect, the dummy substrate Wd to be replaced can be more reliably wetted from the beginning.

The control part 350 may control the first pressure in the latter set (for example the latter half set) to be lower than the first pressure in the former set (for example the first half set). For example, the first pressure in the first set may be higher than the first pressure in the last set. When the first process, the second process, and the replacement process of the dummy substrate Wd are repeated n times, the mean value of the first pressure where the number of repetitions has exceeded half of n may be smaller than the mean value of the first pressure where the number of repetitions is less than half of n. More specifically, if n is an even number, the mean value of the first pressure where the number of repetition is n/2 or less may be larger than the mean value of the first pressure where the number of repetitions is (n/2+1) or more. If n is an odd number, the mean value of the first pressure where the number of repetitions is (n−1)/2 or less may be larger than the mean value of the first pressure where the number of repetitions is (n+1)/2 or more.

The recipe (processing details) to be used may be the same or different between the cleaning process (break-in process) of a new roll cleaning member 90 and the cleaning process of the roll cleaning member 90 having been used to a certain extent (hereinafter also referred to as "maintenance process"). In general, the roll cleaning member 90 is manufactured such that a roll is produced in a sponge-like structure and is processed to provide an internal space for inner rinsing. Therefore, fragments of the roll material generated during manufacturing will remain in the internal space. For this reason, the new roll cleaning member 90 is generally more contaminated than the roll cleaning member 90 already used for cleaning the substrate W. Thus, the maintenance process may have a simple recipe compared with the break-in process. When a plurality of sets of the first process, the second process, and the replacement process of the dummy substrate Wd is performed, the number of sets of the maintenance process may be ½ to ⅓ of the number of sets of the break-in process.

Figure 8:
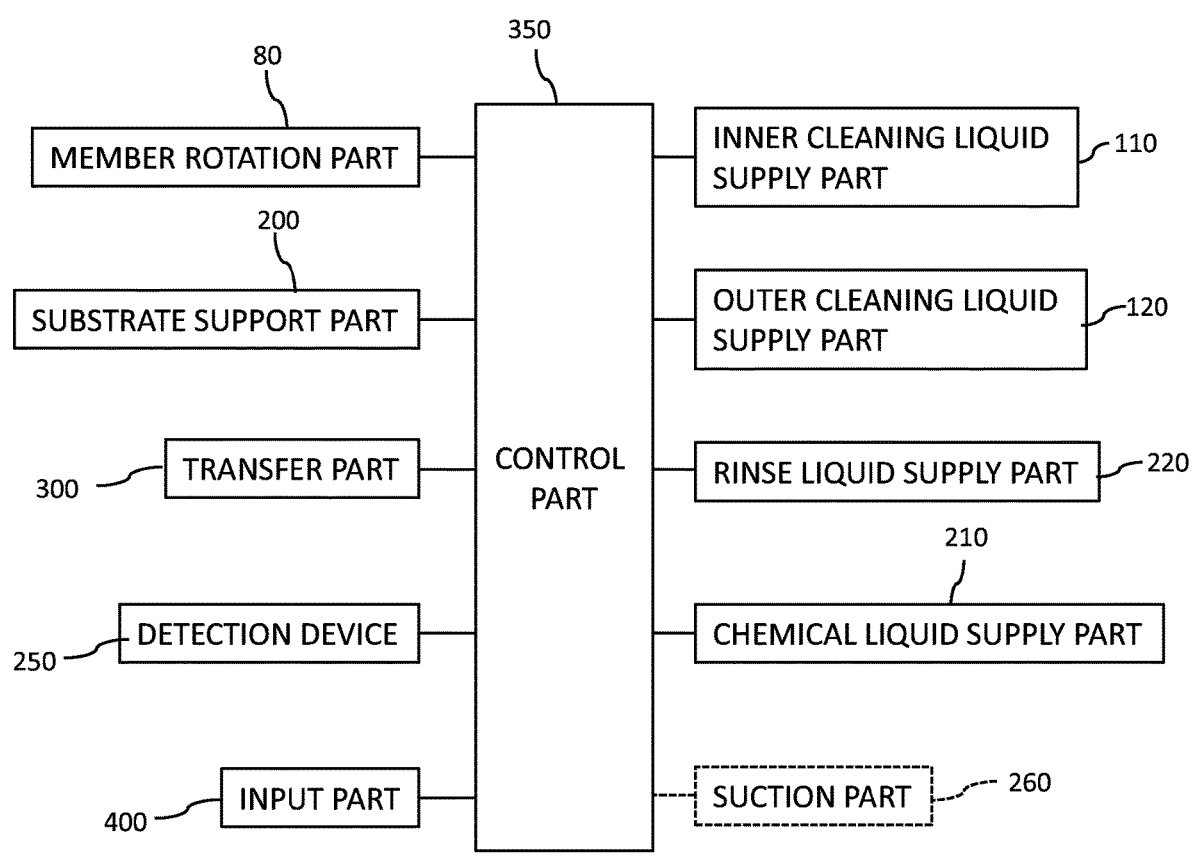
FIG. 8 is a block diagram of a cleaning apparatus for cleaning member that can be used in the embodiment of the present invention.

A detection device 250 for detecting the dirt on the substrate W may be provided (see FIG. 8). When it is determined from the results of detection by the detection device 250 that the dirt on the substrate W has reached a predetermined or higher level (for example, the number of particles has reached a predetermined or larger number), the control part 350 may control the cleaning member such as the roll cleaning member 90 to be cleaned. The cleaning member may be cleaned at the timing when a predetermined number of substrates W has been cleaned. For example, every time 20 substrates W are cleaned, the control part 350 may control the cleaning member to be cleaned using the dummy substrate Wd.

After cleaning of the cleaning member using the dummy substrate Wd, a substrate such as a monitor wafer may be cleaned with the cleaning member, and the dirt on the substrate may be checked by the detection device 250. Otherwise, the cleaning member such as the wet roll cleaning member 90 is squeezed and the detection device 250 may detect particles or the like in the obtained liquid. As the detection device 250, an ICP mass spectrometry (ICP-MS), a liquid chromatograph (LC), SP5 (manufactured by KLA-Tencor Corporation) which is a wafer foreign substances inspection device, or the like may be used.

The inner cleaning liquid supply part 110 and the outer cleaning liquid supply part 120 may supply the same cleaning liquid, but the present invention is not limited to this aspect. The inner cleaning liquid supply part 110 and the outer cleaning liquid supply part 120 may supply different cleaning liquid. For example, the inner cleaning liquid supply part 110 may supply the rinse liquid, and the outer cleaning liquid supply part 120 may supply the chemical liquid. Unlike this aspect, the inner cleaning liquid supply part 110 may supply the chemical liquid, and the outer cleaning liquid supply part 120 may supply the rinse liquid. Otherwise, the inner cleaning liquid supply part 110 may supply a first chemical liquid, and the outer cleaning liquid supply part 120 may supply a second chemical liquid different from the first chemical liquid.

The control part 350 may control the inner cleaning liquid supply part 110 to supply the cleaning liquid while the roll cleaning member 90 is pressed against the dummy substrate Wd at the second pressure. At this time, the second pressure may be lower than the first pressure, and may be ½ or less or ⅓ or less of the first pressure. The pressing force against the dummy substrate Wd is, for example, 1N to 20N, for example, about 6N. When the first pressure is set to 6N in this way, the second pressure may be about 3N. However, the present invention is not limited to this aspect. The second pressure may be the same value as the first pressure, or may be higher than the first pressure.

The control part 350 may control the transfer part 300 to replace the dummy substrate Wd (see FIG. 8). The transfer part 300 may include a load port 312, a first transfer robot part 322, a conveyance unit 324, and a second transfer robot 326 (see FIG. 1). When a dedicated cleaning apparatus for cleaning member is used separately from the substrate cleaning apparatus, a dedicated transfer part 300 may be provided.

The control part 350 may control the first pressure such that, when the first pressure is equal to or higher than a threshold value, the dummy substrate Wd and the roll cleaning member 90 rotate in opposite directions, and when the first pressure is less than the threshold value, the dummy substrate Wd and the roll cleaning member 90 rotate in the same direction. The threshold value may be set in advance or may be set by the user inputting through an input part 400 (see FIG. 8) such as a keyboard and a mouse of a personal computer. In the present embodiment, "the dummy substrate Wd and the roll cleaning member 90 rotate in opposite directions" means that the dummy substrate Wd and the roll cleaning member 90 rotate in opposite directions at the place where the dummy substrate Wd and the roll cleaning member 90 are in contact with each other (see FIG. 11B). In addition, "the dummy substrate Wd and the roll cleaning member 90 rotate in the same direction" means that the dummy substrate Wd and the roll cleaning member 90 rotate in the same direction at the place where the dummy substrate Wd and the roll cleaning member 90 are in contact with each other (see FIG. 11A). To change the rotation direction, the rotation direction of the dummy substrate Wd may be changed or the rotation direction of the roll cleaning member 90 may be changed.

The cleaning liquids supplied from the inner cleaning liquid supply part 110 and the outer cleaning liquid supply part 120 may be an alkaline liquid such as $NH_4OH$.

The outer cleaning liquid supply part 120 may continue to supply the cleaning liquid during the first process and the second process. The inner cleaning liquid supply part 110 may supply the rinse liquid, and may stop the supply of the rinse liquid during the first process. The control part 350 may perform this control of the cleaning liquid and the rinse liquid.

The inner cleaning liquid supply part 110 supplies the cleaning liquid at 50 ml/min to 2500 ml/min, for example, and typically 400 ml/min to 900 ml/min. The outer cleaning liquid supply part 120 may supply the cleaning liquid in a spray form or may supply the cleaning liquid in a linear form. If the amount of the cleaning liquid to be supplied from the inner cleaning liquid supply part 110 is set to less than 50 ml/min, even when the inner cleaning liquid is supplied, the inner cleaning liquid may not be discharged with a uniform discharge pressure from the holes provided in the entire cleaning member. In that case, it cannot be expected that the dirt is physically removed with the discharge pressure. In order to reduce the concern about backflow and reliably supply the inner cleaning liquid into the cleaning member, the amount of the inner cleaning liquid is desirably smaller than 1500 ml/min.

The inner cleaning liquid supply part 110 may supply the chemical liquid with different concentrations. When the inner cleaning liquid supply part 110 and the outer cleaning liquid supply part 120 supply chemical liquids, the chemical liquid supplied from the inner cleaning liquid supply part 110 and the chemical liquid supplied from the outer cleaning liquid supply part 120 may be of different types or may be of the same type with different concentrations.

The control part 350 may control the first time for performing the first process to be longer than the second time for performing the second process.

The control part 350 may control related devices including the outer cleaning liquid supply part 120 to perform a flushing process before cleaning the substrate W such as a mass-produced wafer. The flushing process is a process of cleaning the inside of a cleaning apparatus such as a substrate cleaning apparatus in which the substrate W is not provided or a dedicated cleaning apparatus for cleaning member by spraying a rinse liquid in the apparatus.

The cleaning member assembly 1 may have one end held by the cleaning member holding part 100 in a following manner and the other end driven by the member rotation part 80 with a motor (See FIG. 3). That is, the cleaning member holding part 100 may have a second cleaning member holding part 100*b* driven by the member rotation part 80 and a first cleaning member holding part 100*a* driven in the following manner.

Figure 4:
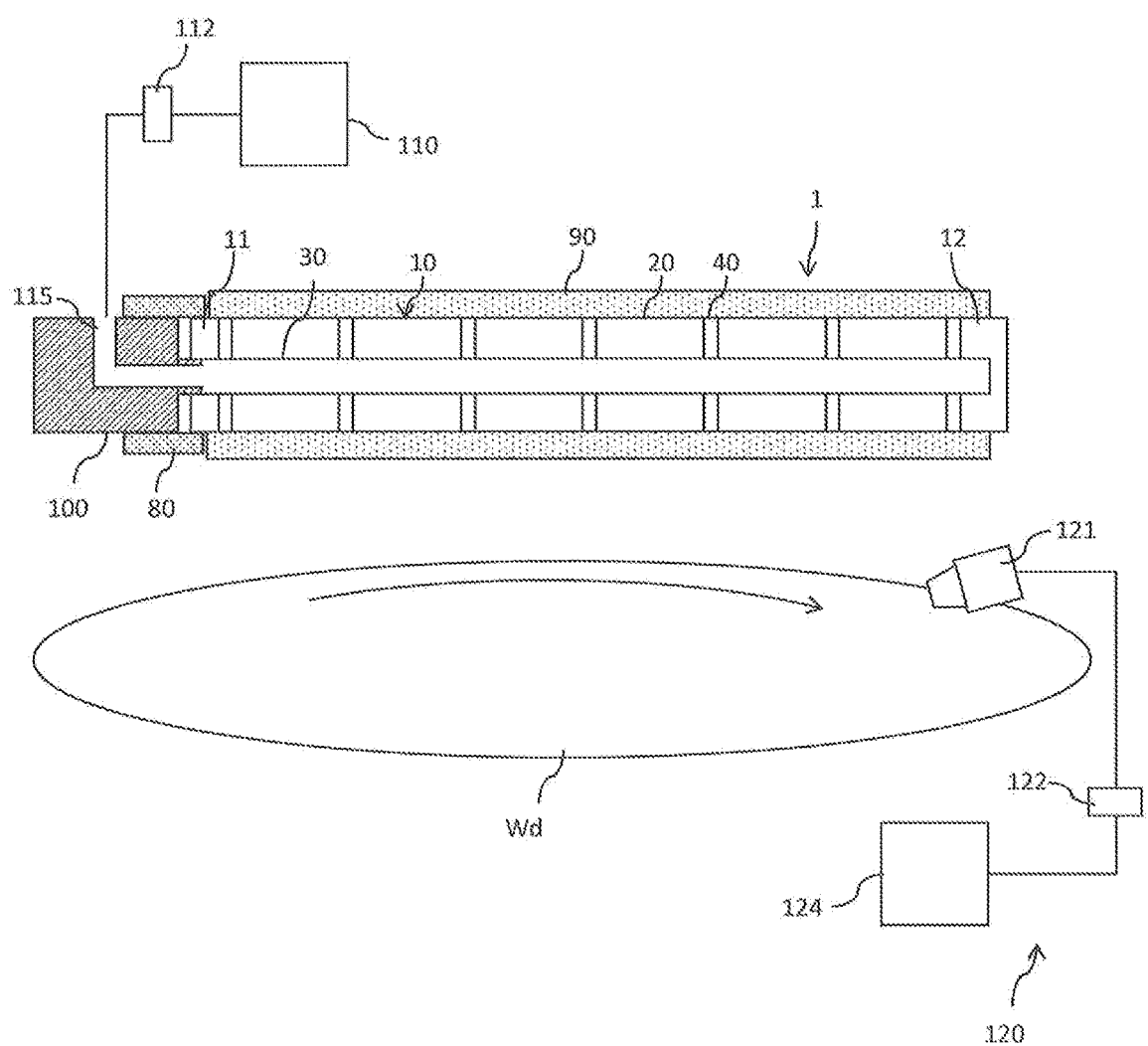
FIG. 4 is a diagram showing a cleaning apparatus for cleaning member used as another example of the embodiment of the present invention.

The roll cleaning member 90 may have a cantilever structure or a double-sided structure. In a case of a cantilever structure, there has been a concern about rotating the cleaning member away from the dummy substrate Wd from a structural point of view. However, the inventors have confirmed that there is no particular problem at a rotation speed of 400 rpm or less. When the roll cleaning member 90 has a cantilever structure, the roll cleaning member 90 may have the member rotation part 80 at the end part where the roll cleaning member 90 is held, and the inner cleaning liquid may be supplied from the end part (see FIG. 4). When the roll cleaning member 90 has a double-sided structure, the rotation speed may be 400 rpm or more if necessary. Even if the roll cleaning member 90 has a cantilever structure, the roll cleaning member 90 can be used at a rotation speed of 400 rpm or more depending on the design specifications.

In supplying the cleaning liquids of the inner cleaning liquid and the outer cleaning liquid, filters 112 and 122 having a mesh of about 1 nm or more may be used, although it depends on the target substrate (see FIG. 3). However, in the future, finer filters may be to meet a request for further miniaturization of the substrate. The use of such filters 112 and 122 enables removal of foreign substances contained in the cleaning liquid. The outer cleaning liquid supply part 120 may include an outer cleaning liquid storage part 124 and an outer cleaning liquid supply member 121 including a nozzle or the like connected to the outer cleaning liquid storage part 124. In this case, the filter 122 may be provided between the outer cleaning liquid storage part 124 and the outer cleaning liquid supply member 121. In addition, the filter 112 may be provided between the inner cleaning liquid supply part 110 and the cleaning member holding part 100.

As shown in FIG. 3, the cleaning member mounting part 10 may have a main body 20, a cleaning liquid introduction part (gap) 30 extending inside the main body 20, and a plurality of cleaning liquid supply holes 40 communicating with the cleaning liquid introduction part 30. The cleaning member mounting part 10 may be formed in a cylindrical shape having a hollow region. This hollow region may constitute the cleaning liquid introduction part 30, and the cleaning liquid supply holes 40 may communicate with the cleaning liquid introduction part 30, so that the cleaning liquid supplied to the cleaning liquid introduction part 30 soaks into the roll cleaning member 90 and may be used to clean the substrate W. FIG. 3 shows a cross section of the roll cleaning member 90 and the like cut at a place where the nodules 95 are not provided.

The cleaning liquid may be introduced into the cleaning liquid introduction part 30 via a supply pipe 115 provided inside the first cleaning member holding part 100*a*.

The dummy substrate Wd may be arranged to be inclined with respect to the horizontal direction, or may be arranged to extend in the vertical direction. The roll cleaning member 90 may be cleaned by using both the front surface and the back surface of the dummy substrate Wd. The cleaning processes using the front surface and the back surface of the dummy substrate Wd may be performed at the same time, or may be performed individually at a time.

In the cleaning member assembly 1, the cleaning member mounting part 10 and the roll cleaning member 90 may be integrally formed, or the roll cleaning member 90 may be formed on the cleaning member mounting part 10. The cleaning member mounting part 10 and the roll cleaning member 90 may be formed as separate members and may be detachable from each other. The roll cleaning member 90 may be made of a porous resin material such as a polyvinyl alcohol (PVA) sponge material or polyvinyl formal (PVFM) formed by reaction with PVA. The PVA sponge material (for example, including PVA-t (polyvinyl acetal) resin material) can be prepared from a homopolymer of polyvinyl acetate or the like. The material of the roll cleaning member 90 may be nylon, polyurethane, or a combination of polyurethane and PVA, or any other moldable material such as other copolymers that do not scratch the substrate surface but provide material removal suitable for the process.

Figure 7:
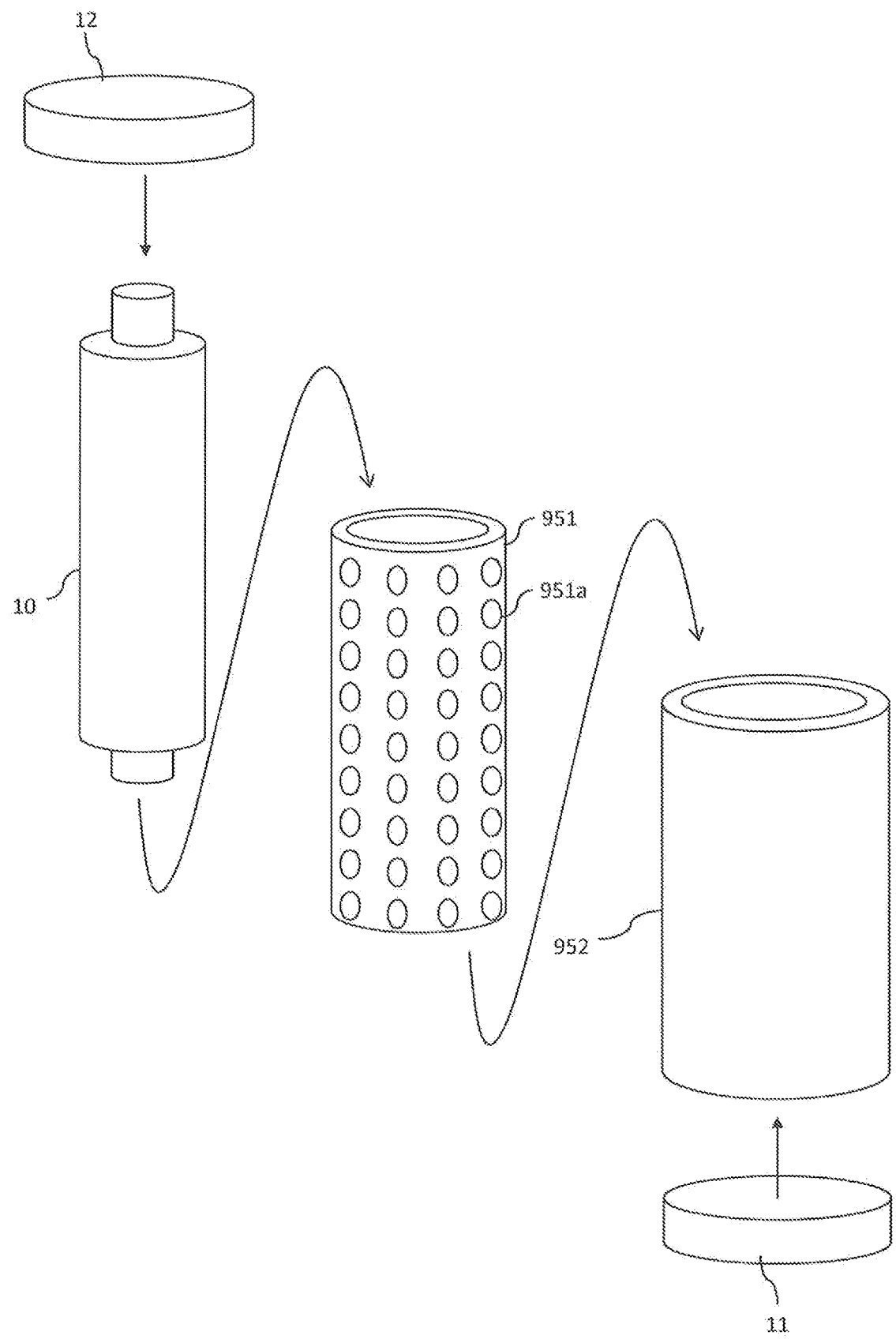
FIG. 7 is a diagram for describing an example of a method of manufacturing an integrally molded cleaning member that can be used in the embodiment of the present invention.

In one embodiment, a mold is formed by a cap member constituting the first end part 11, an inner frame 951 having holes 951*a*, and an outer frame 952 (see FIG. 7). The cleaning member mounting part 10 is inserted into the inner frame 951 forming the mold. After a filler (for example, wax) fills the inside of the cleaning member mounting part 10, a cap member can be attached to the cleaning member mounting part 10 for capping openings of the cleaning liquid supply holes 40. Next, a PVA material constituting the roll cleaning member 90 is mixed with an aqueous solution containing at least a polyvinyl alcohol having a polymerization degree of 500 to 4000 and a saponification degree of 80% or more, and an aldehyde-based cross-linker, a catalyst, and a starch as a pore-forming agent. The mixed liquid (or foaming solution) is poured between the inner frame 951 and the cleaning member mounting part 10 using a nozzle not shown. Thereafter, the cap member constituting the second end part 12 is attached to the cleaning member mounting part 10, the inner frame 951, and the outer frame 952, and is heated at 40 to 80 degrees to react the liquid. In this way, the elongated cleaning member mounting part 10 having a void extending therein and the porous cleaning layer (PVA porous layer) covering the outer surface of the cleaning member mounting part 10 are integrated with the cleaning member mounting part 10, and a plurality of nodules made of the same porous PVA as the cleaning layer is formed to protrude outward.

Each of the inner frame 951 and the outer frame 952 is openable and closable. Then, the inner frame 951 and the outer frame 952 are opened to remove the cleaning member mounting part 10 from the mold. Then, the filler (for example, wax) filling the inside of the cleaning member mounting part 10 is removed by a predetermined method, and the cap member that has capped openings of the cleaning liquid supply holes 40 is removed.

Next, the inside of the cleaning member mounting part 10, the openings of the cleaning liquid supply holes 40, and the roll cleaning member 90 are washed with water. By this series of steps, the roll cleaning member 90 made of a PVA material can be integrally formed (molded) on the cleaning member mounting part 10 with the occurrence of back contamination during use suppressed.

At the manufacture of the roll cleaning member 90 made of a PVA material on the cleaning member mounting part 10 by integral molding, it is possible to mold the roll cleaning member 90 made of a PVA material such that the parts of the roll cleaning member 90 corresponding to the openings of the cleaning liquid supply holes 40 are recessed. With this cleaning member assembly 1, it is possible to more effectively prevent the cleaning liquid discharged from the cleaning member mounting part 10 to the cleaning member 90 from flowing back inside.

The cleaning member assembly 1 can allow the cleaning member mounting part 10 and the roll cleaning member 90 to be firmly stuck together with an adhesive.

In one embodiment, the cleaning member assembly 1 is formed such that the inner diameter of the roll cleaning member 90 is smaller than the outer diameter of the cleaning member mounting part 10, and the roll cleaning member 90 is pressed into the cleaning member mounting part 10 so that the cleaning member mounting part 10 and the roll cleaning member 90 are fixedly supported by the elastic force of the roll cleaning member 90. Further, in one embodiment, a surface active agent is applied to the surface of the cleaning member mounting part 10, then the roll cleaning member 90 is inserted into the cleaning member mounting part 10, and then the cleaning member mounting part 10 and the roll cleaning member 90 can be rinsed with water to remove the surface active agent.

In one embodiment, the average pore diameter of the roll cleaning member 90 can be set to 50 μm to 250 μm (where the average pore diameter is the average of the diameters of a predetermined number of pores randomly extracted from a plurality of pores in the target area). In one embodiment, an apparent density of the roll cleaning member 90 can be 0.05 g/cm$^3$ or more, and a percentage of water retention can be set to 500% to 1200%. Further, in one embodiment, a 30% compressive stress of the roll cleaning member 90 in an appropriate water-containing state can be set to 3 kPa or more to 200 kPa or less. The appropriate water-containing state is a weight percentage in the water-containing state with respect to the dry state, and refers to a water-containing state in which the roll cleaning member 90 has an appropriate elastic force in a cleaning process of the substrate W or the like. In addition, the 30% compressive stress refers to a load per unit area and is obtained as follows. When a load is applied to the roll cleaning member 90 in an appropriate water-containing state from both end surfaces, a load with which the cleaning member 90 is longitudinally 30% crushed is measured by a digital load measuring device, and the measured value is divided by the area of the end surfaces.

Figure 12:
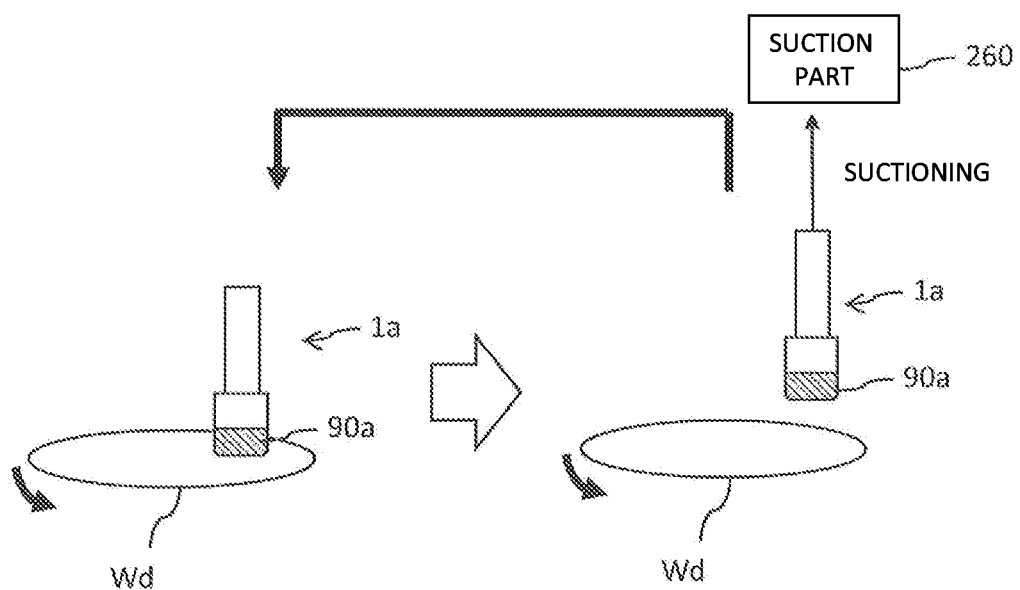
FIG. 12 is a diagram for describing a cleaning method of a pencil cleaning member used in the embodiment of the present invention.

As described above, the pen cleaning member 90*a* may be used as the cleaning member. When the pen cleaning member 90*a* is used as the cleaning member in this way, the cleaning liquid in the pen cleaning member 90*a* may be sucked by a suction part 260 (see FIG. 12) connected to a cleaning member assembly 1*a* (a cleaning member assembly having the pen cleaning member 90*a* is denoted with reference sign "1*a*") in the second process in addition to or instead of rotating the pen cleaning member 90*a*.

An aspect of the present embodiment will be described as examples.

Example 1

Figure 5:
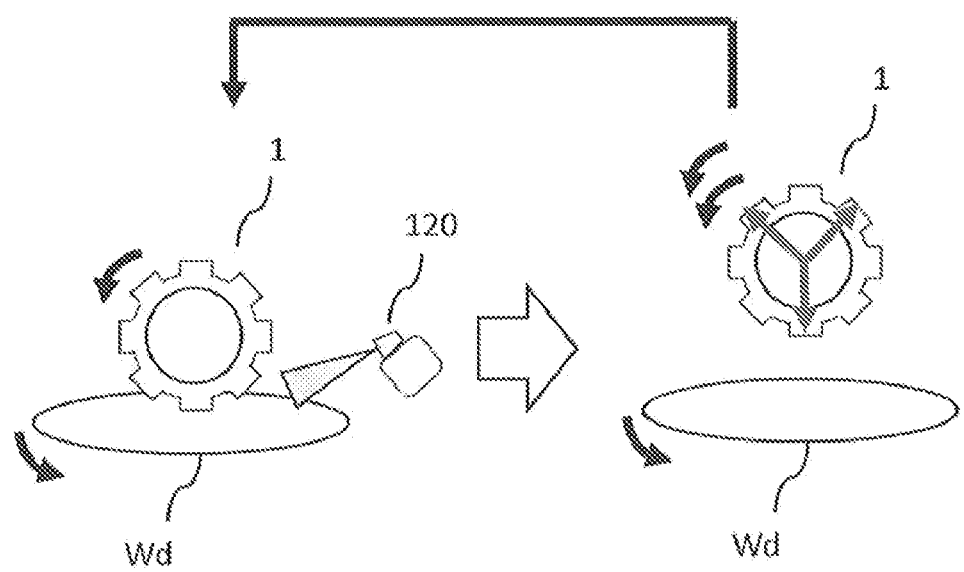
FIG. 5 is a diagram for describing a cleaning method of a roll cleaning member used in the embodiment of the present invention.

In an aspect of Example 1, the inner cleaning liquid supply part 110 does not supply the rinse liquid while the roll cleaning member 90 made of a resin material is pressed against the dummy substrate Wd, and the inner cleaning liquid supply part 110 supplies the rinse liquid while the roll cleaning member 90 is separated from the dummy substrate Wd (see FIG. 5). The rotation speed of the roll cleaning member 90 is 400 rpm (rotation/minute). The outer cleaning liquid supply part 120 continuously supplies the chemical liquid. The chemical liquid is $NH_4OH$, and the rinsing solution is deionized water (DIW). In Example 1, the first process, the second process, and the replacement process of the dummy substrate Wd were repeated.

Comparative Example 1

In Comparative Example 1, the outer cleaning liquid supply part 120 continues to supply the chemical liquid while the roll cleaning member 90 is pressed against the dummy substrate Wd. At this time, the inner cleaning liquid supply part 110 does not supply the rinse liquid.

Figure 9:
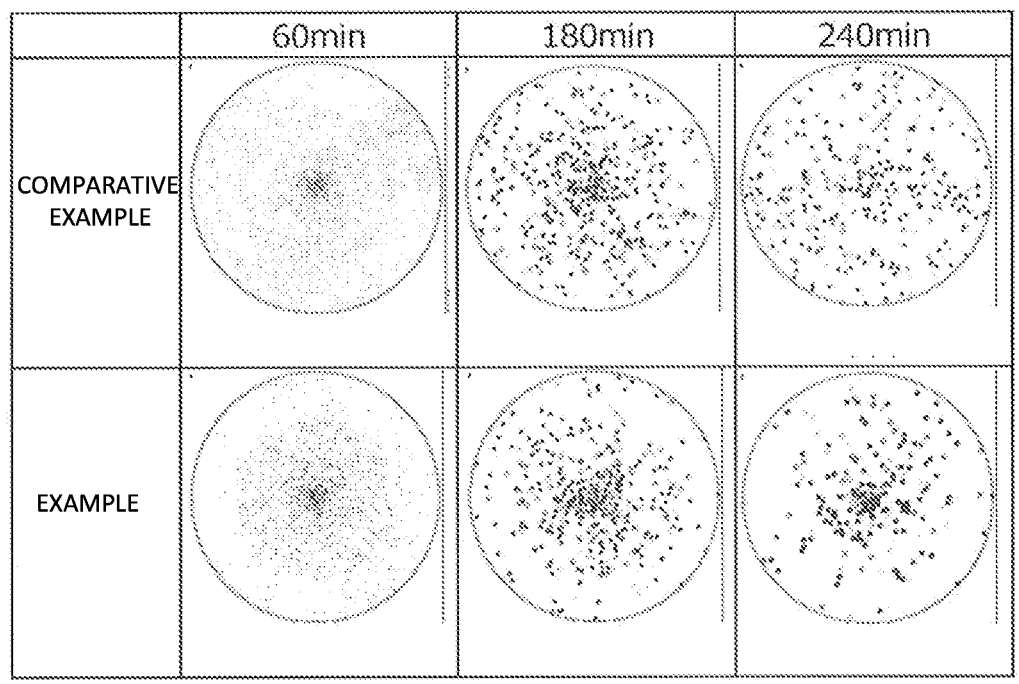
FIG. 9 shows photographs (defect map) of particles of 19 nm or more remaining on a substrate after the use of a cleaning apparatus for cleaning member according to Example 1 of the embodiment of the present invention, and photographs of particles of 19 nm or more remaining on a substrate after the use of a cleaning apparatus for cleaning member according to Comparative Example 1.
Figure 10A:
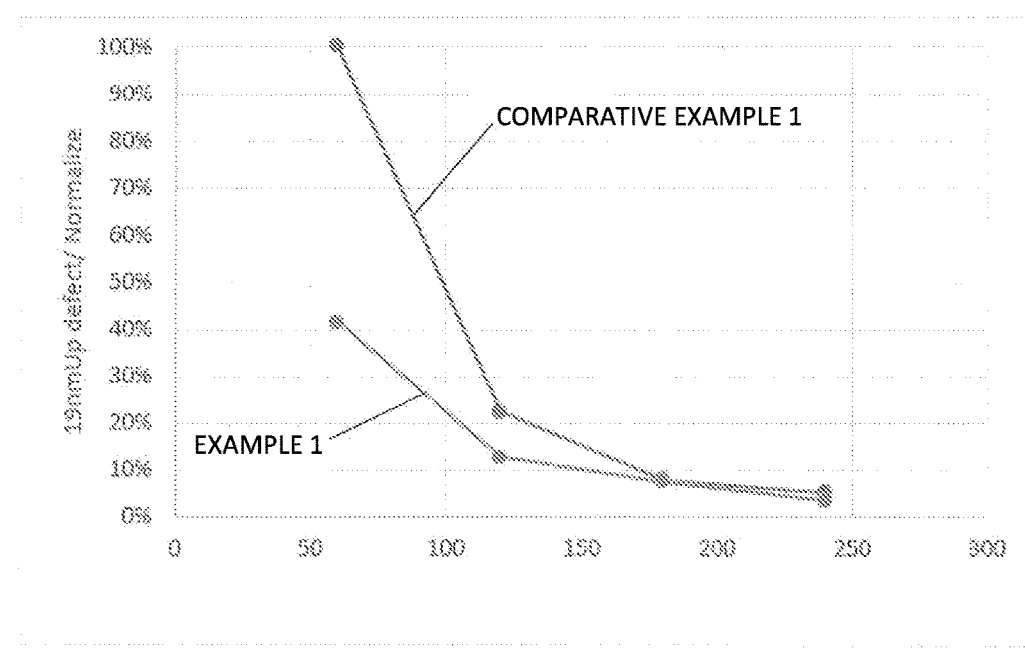
FIGS. 10A and 10B are graphs showing the ratio of the number of the particles of 19 nm or more remaining on the substrate after the use of the cleaning apparatus for cleaning member according to Example 1 of the embodiment of the present invention to the number of the particles of 19 nm or more remaining on the substrate after the use of the cleaning apparatus for cleaning member according to Comparative Example 1.
Figure 10B:
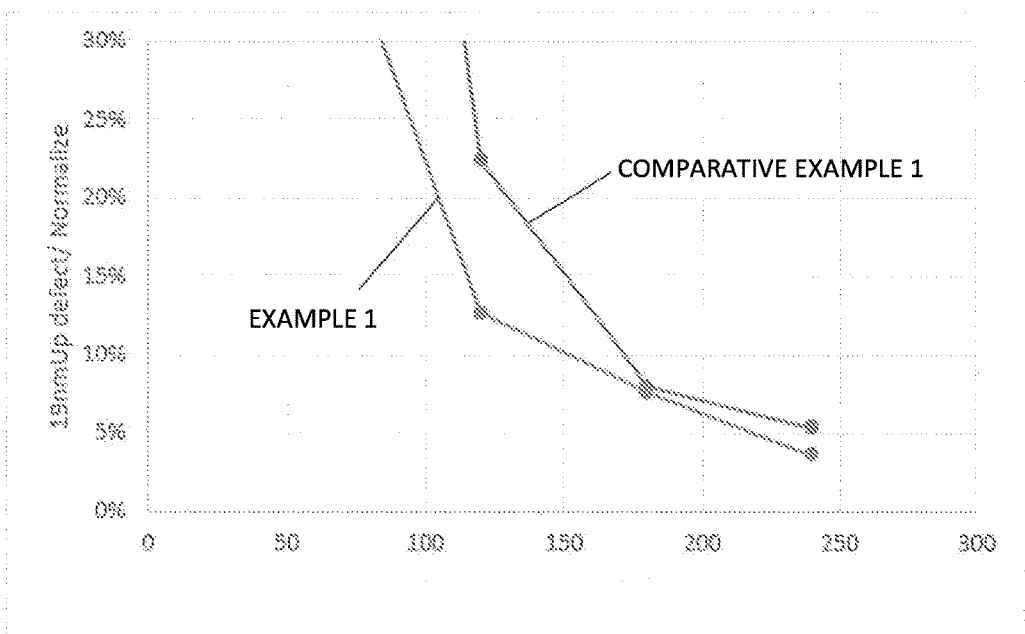

According to Example 1, the number of particles was reduced to about 42% after 60 minutes as compared to Comparative Example 1, and was reduced to about 12% after 180 minutes as compared to the 60-minute-later result of Comparative Example 1 (FIGS. 10A and 10B). According to Comparative Example 1, the number of particles was reduced to a certain number, but it was difficult to reduce the number further. The defect map in FIG. 9 shows these results by photographs. The particles (shown in FIGS. 10A and 10B) referred to in Example 1 of the present embodiment are particles having a maximum diameter of 19 nm or more that can be observed by an inspection device. However, in the future, the accuracy of the inspection device may be improved to observe finer particles to meet demand for further miniaturization of the substrate.

Example 2

Figure 14:
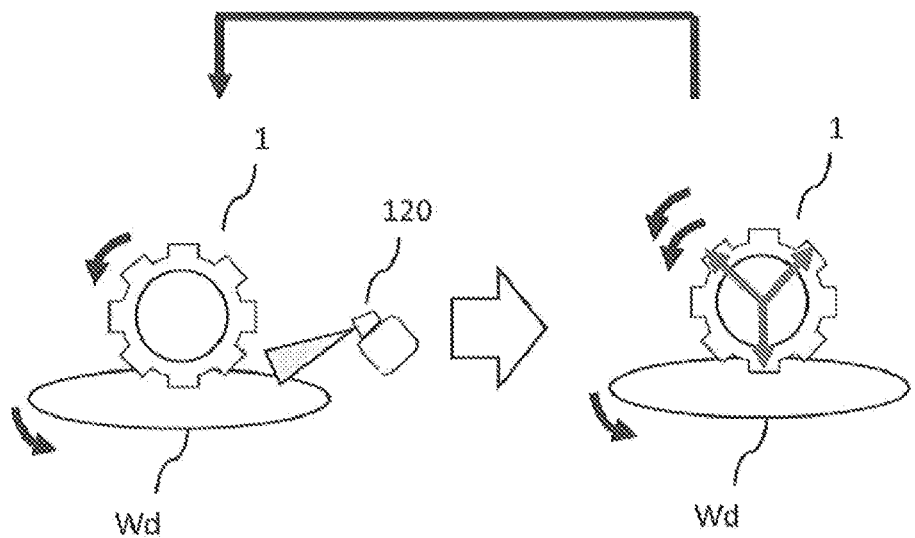
FIG. 14 is a diagram for describing a cleaning method of a roll cleaning member used in Example 2 of the present invention.

In Example 2, the inner cleaning liquid supply part 110 did not supply the rinse liquid while the outer cleaning liquid supply part 120 was supplying the chemical liquid, and after the supply of the chemical liquid from the outer cleaning liquid supply part 120 was stopped, the inner cleaning liquid supply part 110 supplied the rinse liquid at 900 ml/min (see FIG. 14). Meantime, the roll cleaning member 90 made of a resin material was pressed against the dummy substrate Wd with 9N, and the pressing force of the roll cleaning member 90 against the dummy substrate Wd was always set to the same value 9N (that is, the first pressure=the second pressure).

Example 3

Figure 15:
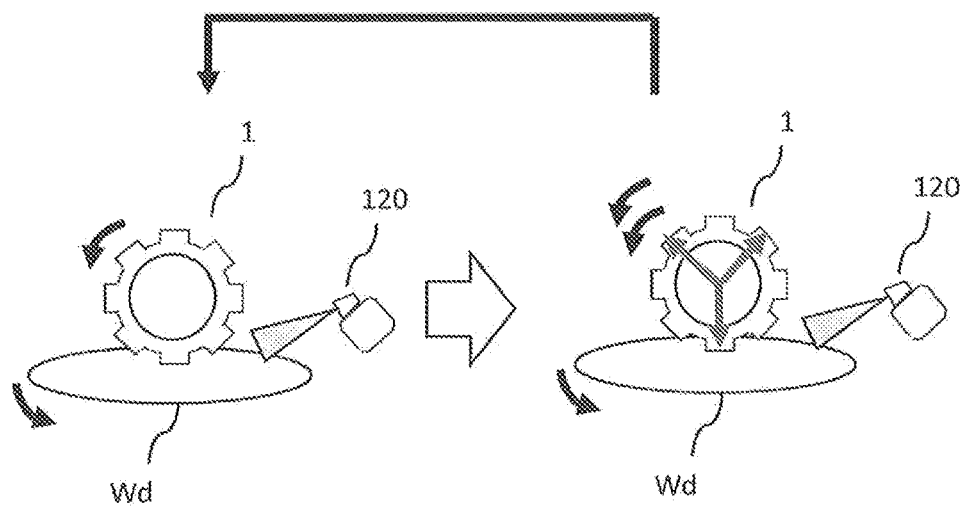
FIG. 15 is a diagram for describing a cleaning method of a roll cleaning member used in Example 3 of the present invention.

In Example 3, the outer cleaning liquid supply part 120 was continuously supplying the chemical liquid, and the inner cleaning liquid supply part 110 supplied the rinse liquid at a fixed timing at 900 ml/min (see FIG. 15). Meantime, like in Example 2, the roll cleaning member 90 made of a resin material was pressed against the dummy substrate Wd with 9N, and the pressing force of the roll cleaning member 90 against the dummy substrate Wd was always set to the same value 9N (that is, the first pressure=the second pressure).

The experiments in Examples 2 and 3 differ from the experiments in Example 1 and Comparative Example 1 in the particle checking method (recipe). Thus, the results of measurement of particles in accordance with the same recipe as that for Examples 2 and 3 in an aspect in which the inner cleaning liquid supply part 110 does not supply the rinse liquid while the roll cleaning member 90 made of a resin material is pressed against the dummy substrate Wd, and the inner cleaning liquid supply part 110 supplies the rinse liquid while the roll cleaning member 90 is separated from the dummy substrate Wd (see FIG. 5), like in Example 1, are shown as Example 4 (see FIG. 16).

Figure 16:
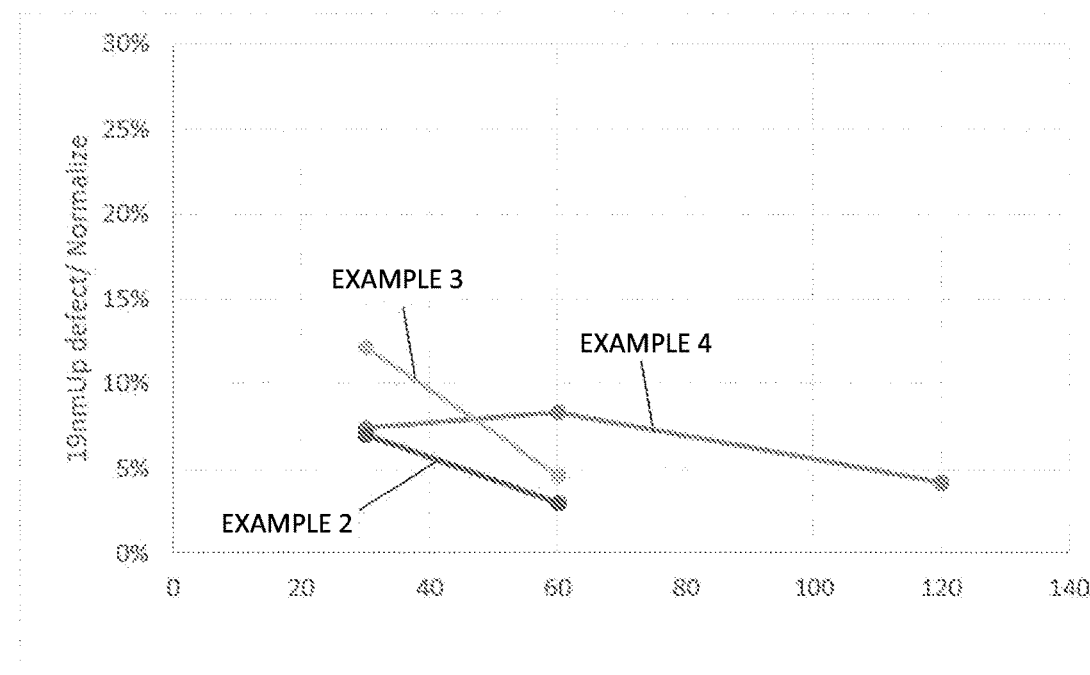
FIG. 16 is a graph showing the ratios of the numbers of particles of 19 nm or more remaining on the substrate in Examples 1 to 3 of the present invention.

In Examples 2 and 3, like in Example 1, particles having a maximum diameter of 19 nm or more and observable by an inspection device were treated as particles, the number of particles was counted, and the count result was compared with the count result of Comparative Example 1 (that is set to 100%) after 60 minutes. FIG. 16 shows comparison results. In Examples 2 and 3, like in Example 1, the first process, the second process, and the replacement process of the dummy substrate Wd were repeated. At the time of replacement of the dummy substrate Wd, the roll cleaning member 90 was separated from the dummy substrate Wd. As described above, a plurality of sets of the first process, the second process, and the replacement process of the dummy substrate Wd may be performed. For example, two to 10 sets may be performed. This also applies to Example 1.

As shown in FIG. 16, in Example 3, the result was reduced to about 3% as compared with the result of Comparative Example 1 after 60 minutes, and in Example 2, the result was reduced to about 5% as compared with the result of Comparative Example 1 after 60 minutes. Since the result of Example 4 corresponding to Example 1 was about 8% as compared with the result of Comparative Example 1 after 60 minutes, Examples 2 and 3 have also been found to have an advantageous effect as compared with Example 4.

It is advantageous to have the significantly reduced number of particles in each of Examples 2 and 3 in a short time as 60 minutes. In particular, the aspect of Example 2 yielded even better results than those of the aspect of Example 3, and it has been confirmed that the aspect of Example 2 is advantageous. That is, it has been confirmed that it is particularly advantageous to use the aspect in which, during the second process, the outer cleaning liquid supply part 120 stops the supply of the cleaning liquid to the dummy substrate Wd while the roll cleaning member 90 is pressed against the dummy substrate Wd, but it is also advantageous to use the aspect in which, during the second process, the outer cleaning liquid supply part 120 supplies the cleaning liquid to the dummy substrate Wd while the roll cleaning member 90 is pressed against the dummy substrate Wd. In Examples 2 to 4, the roll cleaning member 90 is pressed against the dummy substrate Wd with a force of 9N. Advantageously, the roll cleaning member 90 is pressed against the dummy substrate Wd with a force of 5N or more, more advantageously, the roll cleaning member 90 is pressed against the dummy substrate Wd with a force of 9N or more, and even more advantageously, the roll cleaning member 90 is pressed against the dummy substrate Wd with a force of 15N or more.

«Effects»

Next, effects of the thus configured present embodiment, which have not yet been described, will be mainly described. Even if it is not described in the Configuration, any configuration described in the effects can be adopted in the present invention. The term "effect" will be described using the term "cleaning member" instead of the term "roll cleaning member" which is an example of the cleaning member.

Figure 6:
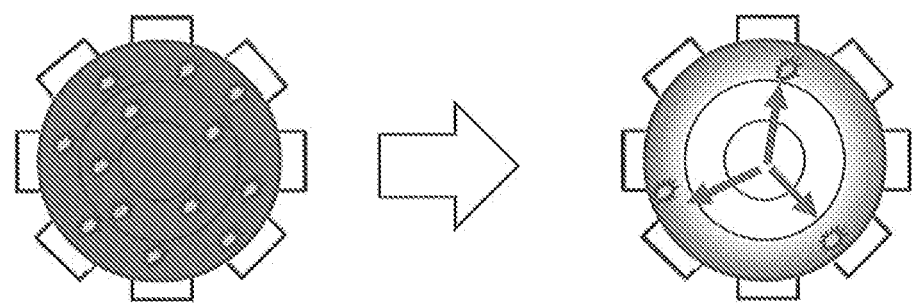
FIG. 6 is a diagram for describing the removal of foreign substances in the cleaning member according to an aspect of the embodiment of the present invention.

When the control part 350 performs the first process in which the outer cleaning liquid supply part 120 supplies the cleaning liquid to the dummy substrate Wd while the cleaning member to be cleaned is pressed against the dummy substrate Wd at the first pressure and the second process in which the outer cleaning liquid supply part 120 supplies the cleaning liquid from the inner cleaning liquid supply part 110 to the dummy substrate Wd while the cleaning member is separated from the dummy substrate Wd or is pressed against the dummy substrate Wd at the second pressure equal to or lower than the first pressure, the cleaning time of the cleaning member can be significantly shortened (see FIGS. 10A and 10B). When the cleaning member is pressed against the dummy substrate Wd while supplying the cleaning liquid from the outer cleaning liquid supply part 120, dirt on the outer surface of the cleaning member can be removed. Further, when the inner cleaning liquid supply part 110 supplies the cleaning liquid while the cleaning member is separated from the dummy substrate Wd or the cleaning member is pressed against the dummy substrate Wd at the second pressure equal to or lower than the first pressure, foreign substances in the cleaning member can be efficiently pushed out (see FIG. 6).

In recent years, there has been a demand for removal of small-sized foreign substances. The aspect of the present embodiment is advantageous in that small-sized foreign substances can be efficiently removed. In addition, the present embodiment allows the cleaning member to be kept at a high level of cleanliness, which leads to extended life and stable production of the cleaning member.

The inventors of the present application have confirmed that making the second rotation speed of the cleaning member during the second process higher than the first rotation speed of the cleaning member during the first process would enhance the cleaning effect of the cleaning member.

When the inner cleaning liquid supply part 110 and the outer cleaning liquid supply part 120 supply different cleaning liquids, the cleaning member can be cleaned more effectively depending on the material of the cleaning member.

When the inner cleaning liquid supply part 110 supplies the rinse liquid and the outer cleaning liquid supply part 120 supplies the chemical liquid, adopting the aspect in which the first time for performing the first process is longer than the second time for performing the second process will be advantageous in that the cleaning member can be enriched with the chemical liquid to enhance the cleaning effect.

When the inner cleaning liquid supply part 110 supplies the cleaning liquid while the cleaning member is pressed against the dummy substrate Wd at the second pressure, it is possible to prevent the dirt adhering to the dummy substrate Wd from returning to the cleaning member. Therefore, the cleaning member can be cleaned more effectively.

When the control part 350 controls the transfer part 300 to replace the dummy substrate Wd, the dummy substrate Wd can be automatically replaced in the cleaning process of the cleaning member.

When the control part 350 performs a plurality of sets of the first process, the second process, and the replacement process of the dummy substrate Wd, the effective cleaning process of the cleaning member can be automatically performed.

When the control part 350 controls the first pressure in the latter set to be smaller than the first pressure in the former set, the occurrence of back contamination can be prevented. After the cleaning process is completed, the substrate W such as a wafer will be cleaned. However, there may be a possibility that dirt on the dummy substrate Wd adheres to the cleaning member during the cleaning process. Such contamination can occur when the cleaning member is strongly pressed against the dummy substrate Wd. Thus, making the first pressure in the latter set smaller than the first pressure in the former set is advantageous in reducing the risk of back contamination.

Adopting an aspect in which the dummy substrate Wd and the cleaning member rotate in opposite directions at the first pressure equal to or higher than the threshold value allows the cleaning member to be cleaned with a larger amount of cleaning liquid stored in the place where the dummy substrate Wd contacts with the cleaning member. In general, the cleaning member can be cleaned more effectively in a case where the cleaning member is strongly pressed against the dummy substrate Wd. According to this mode, in such a case, a larger amount of cleaning liquid can be stored in the place where the dummy substrate Wd contacts with the cleaning member.

When the dummy substrate Wd and the cleaning member are controlled to rotate in the same direction at the first pressure lower than the threshold value, it is possible to keep the cleaning member from being immersed in a large amount of cleaning liquid in a case where the cleaning member needs relatively less effective cleaning. Keeping the cleaning member from being immersed in a large amount of cleaning liquid in this way can prevent the occurrence of back contamination from the dummy substrate Wd to the cleaning member.

Figure 11A:
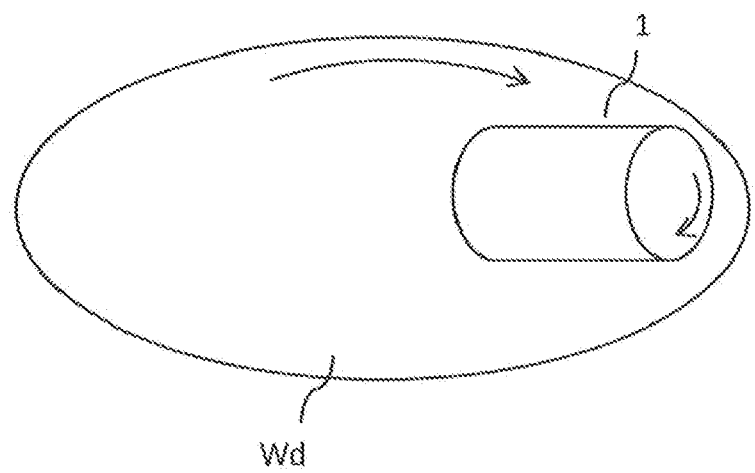
FIG. 11A shows an aspect in which a dummy substrate and the roll cleaning member rotate in the same direction at the place where the dummy substrate and the roll cleaning member contact with each other.
Figure 11B:
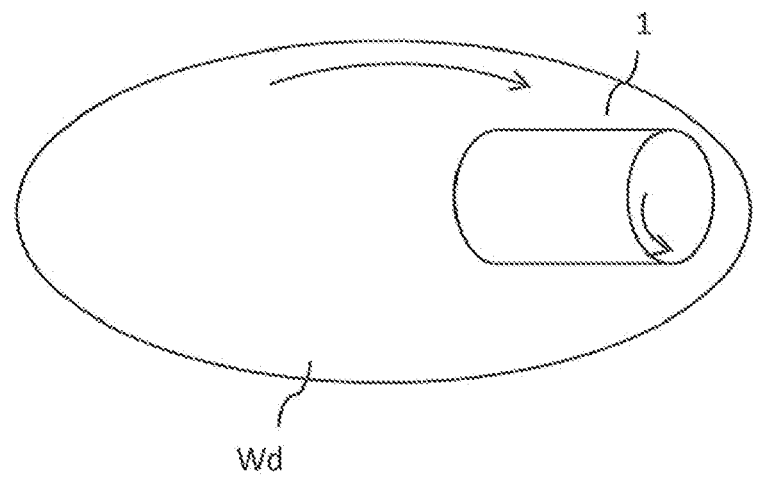
FIG. 11B shows an aspect in which the dummy substrate and the roll cleaning member rotate in opposite directions at the place where the dummy substrate and the roll cleaning member contact with each other.

As an example, in the first half set in which the first pressure is high, the control part 350 may control the dummy substrate Wd and the cleaning member to rotate in opposite directions (see FIG. 11B), and in the latter set in which the first pressure is low, the control part 350 may control the dummy substrate Wd and the cleaning member to rotate in the same direction (see FIG. 11A).

By using a chemical liquid as the cleaning liquid, a negative potential can be generated, and as a result, a high zeta potential can be generated. Thus, a repulsive force can be generated between the cleaning member and the foreign substances, or a repulsive force can be generated between foreign substances so that the foreign substances can be easily removed. From this point of view, it is advantageous to use an alkaline chemical liquid. This is because an alkaline chemical liquid such as $NH_4OH$ has a larger negative potential than an acidic chemical liquid. Even when the cleaning liquid used in the cleaning process of the substrate W is an acidic chemical liquid, an alkaline chemical liquid may be used in the cleaning process of the cleaning member. On the other hand, the cleaning member may be cleaned using the same chemical liquid as that used in the cleaning process of the substrate W. In this case, it is advantageous in that it is not necessary to change the apparatus configuration.

In a case of adopting an aspect in which the outer cleaning liquid supply part 120 continuously supplies the cleaning liquid between the first process and the second process, the dummy substrate Wd can be kept wet constantly. When the dummy substrate Wd becomes dry, the possibility of foreign substances adhering to the cleaning member increases. Therefore, it is advantageous to keep the dummy substrate Wd in a constantly wet state by the outer cleaning liquid supply part 120. From this point of view, it is advantageous to start the cleaning process of the cleaning member including the break-in process after wetting the dummy substrate Wd with the cleaning liquid.

In the cleaning process of a new cleaning member (in the break-in process), the cleaning member may be pre-wetted with the cleaning liquid. Back contamination of the cleaning member may occur if the cleaning member in a dry state is subjected to the cleaning process. For this reason, it is advantageous to adopt such an aspect. The control part 350 may control the cleaning member to become immersed in the cleaning liquid in order to wet the cleaning member with the cleaning liquid, or the control part 350 may control the cleaning process of the cleaning member to be started after the inner cleaning liquid supply part 110 supplies a certain amount of cleaning liquid. The inventors have confirmed that the use of a chemical liquid, not a rinse liquid, as the cleaning liquid for wetting the cleaning member would produce a high cleaning effect.

When the inner cleaning liquid supply part 110 supplies the rinse liquid and the outer cleaning liquid supply part 120 supplies the chemical liquid, the inner cleaning liquid supply part 110 may stop the supply of the rinse liquid while the cleaning member is in contact with the dummy substrate Wd. This is because if the inner cleaning liquid supply part 110 continuously supplies the rinse liquid, the chemical liquid supplied from the outer cleaning liquid supply part 120 will become diluted to decrease the cleaning effect. When the inner cleaning liquid supply part 110 supplies the chemical liquid, the inner cleaning liquid supply part 110 may supply the chemical liquid even while the cleaning member is in contact with the dummy substrate Wd.

When the cleaning member is rotated, the cleaning liquid may be scattered in the apparatus, which may adversely affect the cleaning of the mass-produced substrate W. From this point of view, when the substrate cleaning apparatus is used as the cleaning apparatus for cleaning member, flushing the inside of the apparatus before starting cleaning of the mass-produced substrate W can advantageously prevent adverse effects due to the scattered cleaning liquid. Further, from the viewpoint of preventing the cleaning liquid from scattering into the apparatus, when the substrate cleaning apparatus is used as the cleaning apparatus for cleaning member, the downflow in the apparatus may be increased in the cleaning process of the cleaning member as compared with the cleaning of the substrate W.

In one embodiment, the processing object to be cleaned by the cleaning member is not limited to a semiconductor wafer, but may be a silicon wafer, a glass substrate, a printed wiring board, a liquid crystal panel, or a solar panel. Further, the shape of the plane of the processing object may be circular or rectangular, and the thickness of the plane may be a thickness that allows in-plane deflection. The substrate to be processed includes a square substrate and a circular substrate. Further, the rectangular substrate includes a glass substrate, a liquid crystal substrate, a printed circuit board, with a polygonal shape such as a rectangle, and other polygonal plating objects. The circular substrate includes a semiconductor wafer, a glass substrate, and other circular plating objects.

As the cleaning liquid, high-temperature pure water, ammonium hydrogen-peroxide mixture (APM), sulfuric-acid hydrogen peroxide mixture (SPM), carbonated water, ultrasonic water, ozone water and others are applicable.

The above description of the embodiments and the disclosure of the drawings are merely examples for describing the invention defined in the claims, and the invention defined in the claims is not limited by the above description of the embodiments and the disclosure of the drawings. In addition, the description of the claims at the time of filing is only an example, and the description of the claims can be changed as appropriate based on the description of the description, drawings, and the like.

REFERENCE SIGNS LIST

80 Member rotation part
90 Cleaning member
100 Holding part
110 Inner cleaning liquid supply part
120 Outer cleaning liquid supply part
350 Control part
Wd Dummy substrate

The invention claimed is:

1. A cleaning apparatus for a cleaning member comprising:
　a substrate support part that holds a substrate;
　a holding part that holds a cleaning member assembly having the cleaning member;
　a member rotation part that rotates the cleaning member;
　an inner cleaning liquid supply part that supplies a first cleaning liquid into the cleaning member;
　an outer cleaning liquid supply part that supplies a second cleaning liquid from outside of the cleaning member; and
　a control part that controls the cleaning apparatus to perform a first process in which the cleaning member is pressed against the substrate at a first pressure and the outer cleaning liquid supply part supplies the second cleaning liquid to the substrate, and to perform a second process in which the cleaning member is separated from the substrate or is pressed against the substrate at a second pressure which is equal to or less than the first pressure and the inner cleaning liquid supply part supplies the first cleaning liquid,
　wherein a second rotation speed of the cleaning member during the second process is higher than a first rotation speed of the cleaning member during the first process.

2. The cleaning apparatus for the cleaning member according to claim 1, wherein
　the outer cleaning liquid supply part stops a supply of the second cleaning liquid to the substrate during the second process.

3. The cleaning apparatus for the cleaning member according to claim 1, wherein the outer cleaning liquid supply part supplies the second cleaning liquid to the substrate during the second process.

4. The cleaning apparatus for the cleaning member according to claim 1, wherein the inner cleaning liquid supply part supplies a rinse liquid and the outer cleaning liquid supply part supplies a chemical liquid, the inner cleaning liquid supply part supplies the chemical liquid and the outer cleaning liquid supply part supplies the rinse liquid, or the inner cleaning liquid supply part and the outer cleaning liquid supply part supplies the chemical liquid.

5. The cleaning apparatus for the cleaning member according to claim 1, wherein
　the inner cleaning liquid supply part supplies a first chemical liquid, and the outer cleaning liquid supply part supplies a second chemical liquid different from the first chemical liquid.

6. The cleaning apparatus for the cleaning member according to claim 1, wherein the control part controls the inner cleaning liquid supply part to supply the first cleaning liquid while the cleaning member is pressed against the substrate at the second pressure, and
the second pressure is ½ or less of the first pressure.

7. The cleaning apparatus for the cleaning member according to claim 1, wherein
　the control part controls a transfer part to replace the substrate, and controls the cleaning apparatus to perform a plurality of sets of the first process, the second process and a replacement process of the substrate.

8. The cleaning apparatus for the cleaning member according to claim 7, wherein
　the plurality of sets comprises at least a latter set and a former set,
　the first pressure in the latter set is lower than the first pressure in the former set.

9. The cleaning apparatus for the cleaning member according to claim 1, wherein
　the outer cleaning liquid supply part continues to supply the second cleaning liquid during the first process and the second process, and
　the inner cleaning liquid supply part supplies a rinse liquid, and stops a supply of the rinse liquid during the first process.

10. The cleaning apparatus for the cleaning member according to claim 1, wherein
　the control part controls the outer cleaning liquid supply part to perform a flushing process before cleaning the substrate to which a cleaning process will be performed.

11. A cleaning apparatus for a cleaning member comprising:
　a substrate support part that holds a substrate;
　a holding part that holds a cleaning member assembly having the cleaning member;
　a member rotation part that rotates the cleaning member;
　an inner cleaning liquid supply part that supplies a first cleaning liquid into the cleaning member;
　an outer cleaning liquid supply part that supplies a second cleaning liquid from outside of the cleaning member; and
　a control part that controls the cleaning apparatus to perform a first process in which the cleaning member is pressed against the substrate at a first pressure and the outer cleaning liquid supply part supplies the second cleaning liquid to the substrate, and to perform a second process in which the cleaning member is separated from the substrate or is pressed against the substrate at a second pressure which is equal to or less than the first pressure and the inner cleaning liquid supply part supplies the first cleaning liquid, wherein
　the cleaning member is a roll cleaning member which has a length less than half of a length of the substrate and which contacts the substrate at an outside of a rotation center of the substrate, and
　the control part controls such that the substrate and the cleaning member rotate in opposite directions when the first pressure is equal to or higher than a threshold value, and the substrate and the cleaning member rotate in a same direction when the first pressure is less than the threshold value.

12. A substrate cleaning apparatus for cleaning a substrate comprising:
　a substrate support part that holds the substrate;
　a substrate cleaning liquid supply part that supplies a third cleaning liquid to the substrate;

a holding part that holds a cleaning member assembly having a cleaning member;

a member rotation part that rotates the cleaning member;

an inner cleaning liquid supply part that supplies a first cleaning liquid into the cleaning member;

an outer cleaning liquid supply part that supplies a second cleaning liquid from outside of the cleaning member; and a control part that controls the substrate cleaning apparatus to perform a first process in which the cleaning member is pressed against the substrate at a first pressure and the outer cleaning liquid supply part supplies the second cleaning liquid to the substrate, and to perform a second process in which the cleaning member is separated from the substrate or is pressed against the substrate at a second pressure which is equal to or less than the first pressure and the inner cleaning liquid supply part supplies the first cleaning liquid, wherein a second rotation speed of the cleaning member during the second process is higher than a first rotation speed of the cleaning member during the first process.

13. The substrate cleaning apparatus according to claim 12 further comprising a torque detection part that detects torques, which are generated when the cleaning member is pressed against the substrate, multiple times within a predetermined time, wherein the control part controls a pressing force against the substrate by the cleaning member based on values of a plurality of the torques detected by the torque detection part.

* * * * *